United States Patent [19]

Vaillancourt

[11] Patent Number: 5,299,202

[45] Date of Patent: Mar. 29, 1994

[54] METHOD AND APPARATUS FOR CONFIGURATION AND TESTING OF LARGE FAULT-TOLERANT MEMORIES

[75] Inventor: Steven Vaillancourt, Carson, Calif.

[73] Assignee: TRW Inc., Redondo Beach, Calif.

[21] Appl. No.: 623,855

[22] Filed: Dec. 7, 1990

[51] Int. Cl.$^5$ ............................................. G06F 11/00
[52] U.S. Cl. .................. 371/11.1; 371/21.1; 371/21.6
[58] Field of Search .................. 371/11.1, 21.1, 21.6, 371/10.1; 365/200; 395/575

[56] References Cited

U.S. PATENT DOCUMENTS

| | | | |
|---|---|---|---|
| 4,066,880 | 1/1978 | Salley | 235/302.3 |
| 4,191,996 | 3/1980 | Chesley | 364/200 |
| 4,468,731 | 8/1984 | Johnson et al. | 371/11.1 X |
| 4,566,102 | 1/1986 | Hefner | 371/11.1 |
| 4,653,050 | 3/1987 | Vaillancourt | 371/10.1 |

*Primary Examiner*—Robert W. Beausoliel, Jr.
*Assistant Examiner*—Ly V. Hua
*Attorney, Agent, or Firm*—Ronald L. Taylor; Noel F. Heal

[57] ABSTRACT

In a large semiconductor memory having multiple memory modules that are addressable by a logical page address and a word address within each page, a technique for automatically testing the modules to establish a pool of good modules; then allocating each logical page of memory to a group of modules, with each module in the group being assigned to a particular bit position in all of the data words in the page. After allocation of each page, the modules in the page are tested in various ways to verify that they are fully functional. Modules not passing any of the tests are replaced by others from the pool of good modules. If the pool is exhausted, a partial page is de-allocated. Tests performed on the modules making up a logical page include a random access memory test, a test on bus connections to each module, and tests on the other major components of each module.

20 Claims, 23 Drawing Sheets

METHOD AND APPARATUS FOR CONFIGURATION AND TESTING OF LARGE FAULT-TOLERANT MEMORIES

BACKGROUND OF THE INVENTION

This invention relates generally to semiconductor memory structures and, more particularly, to techniques for configuring and testing very large memory arrays, which have a relatively high probability of containing defective memory cells. A semiconductor integrated-circuit memory takes the form of a two-dimensional array of memory cells fabricated together on a single semiconductor chip. Each memory cell typically stores one binary digit or bit of information, and the array is usually designed to store multiple "words" of information, each word having the same number of bits. A common data word length is eight bits, which is referred to as a "byte." For convenience in handling binary cell addresses, the number of words in a memory array is usually a power of two, such as 1,024, 2,048, 4,096, and so forth. Each 1,024 words or bytes of memory is often referred to as "1 k" of memory. For example, a 2 k memory contains 2,048 words, bytes or bits of memory.

As the area of a semiconductor chip increases, so does the probability that there will be manufacturing defects within the chip. The manufacturing "yield" is the percentage of defect-free chips obtained in a production run. The probability of occurrence of manufacturing defects in a unit surface chip area is approximately constant for a particular fabrication process. Therefore, larger chips will have more defects and a lower yield of defect-free circuits. Although the area of a specific circuit can be decreased by further reducing the scale of integration, i.e. by reducing the size of the circuit features and their spacing, this will ultimately result in an increase in the number of defects and a reduction in the production yield.

An alternative to reducing the size of a circuit is to increase the effective production yield by rendering the resulting circuits more tolerant to defects, so that defective circuits can be repaired rather than discarded. Basically, this approach involves designing the circuit to include redundant or spare components, which can be connected into the circuit to replace components that have become defective.

Another source of defects is radiation damage. This is highly significant for applications of circuitry to be used in space, where memory cells are subject to damage by cosmic radiation. If only a single memory cell were to be damaged, the defect could be overcome by the use of an appropriate error detection and correction technique. A single-bit error in a relatively large data word can be detected and corrected in this way without the need for reconfiguring the circuitry. However, there is a high probability that a cosmic radiation "strike" on a memory cell would disable not just one cell, but several physically adjacent cells as well. If these damaged cells were all in the same data word, recovery by error detection and correction methods would not be possible. Accordingly, the ideal technique for reconfiguring a memory circuit should be one that minimizes the effects of radiation damage, and permits reconfiguration at any time after manufacture of the circuit.

Without some technique for increasing the production yield of semiconductor memory arrays, the size of such arrays is effectively limited and may not be easily increased to encompass an entire semiconductor wafer. U.S. Pat. No. 4,653,050 to Vaillancourt proposes a solution to this problem, whereby a large memory array comprises a number of memory modules, each of $1 \times N$ bits in size. The memory array is treated as having P logical "pages," each with N multibit words. Each module provides one bit of memory at the same bit position in every word in a logical page of memory. A damaged module therefore affects only one bit in each word, and the missing bit can be reconstructed using conventional error detection and correction techniques. A memory mapping module provides transformation from logical memory addresses to physical addresses within the modules. Although this approach is satisfactory in many applications, it has the disadvantage that a single, relatively complex memory mapping unit is responsible for mapping memory locations for the entire memory array.

An ideal wafer-scale memory array has the ability to distribute each bit of a stored data word to a different memory module. However, for a 32-bit data word, for example, this would appear to require that a 32-bit data bus be connected to each of the memory modules in the array. This routing of the data bus over a large area of the circuit would render the array more vulnerable to defects, whether resulting from manufacture or from radiation damage. Therefore, any scheme for minimizing damage to the memory array should minimize the extent to which the data bus has to be routed throughout the array. One approach to solving these problems was described and claimed in a patent application Ser. No. 07/498,882 filed on Mar. 26, 1990 in the name of Cameron Wade, and since issued as U.S. Pat. No. 5,103,424.

Regardless of which specific hardware configuration is used to address these problems, there is still a need for an automatic technique for testing and reconfiguring very large memories that include redundant memory modules. Ideally, what is needed is a memory system that automatically tests and reconfigures itself upon powering up, or at any other time on demand. The present invention achieves this end and has other significant advantages.

SUMMARY OF THE INVENTION

The present invention resides in apparatus, and a method of its operation, for automatically testing and reconfiguring a very large memory having multiple modules that can be selectively disabled when found to be defective. Basically the invention takes the form of a large memory circuit, addressable by a logical memory address that includes a memory page address and a memory word address within the specified page. The circuit comprises a plurality of memory modules, each having at least as many bits as there are memory words in a memory page, a global data bus having as many data lines as there are bits in a data word, a global address bus connected to the memory modules, memory module mapping means, for associating each combination of memory page and bit position within each data word on that page, with a unique selected memory module, and memory circuit testing and configuration means. The latter element is the heart of the present invention and functions to automatically test each of the memory modules and to record, in the memory module mapping means, codes that associate each memory page and bit position combination with a unique memory module.

More specifically, the memory circuit testing and configuration means includes means for testing each memory module to determine that it responds to a unique module address, means for testing interconnections between the global data bus and the memory modules, and means for storing a code in each tested module identifying it as having passed or failed the tests, those that have passed forming a pool of good modules. In the illustrative embodiment of the invention, each memory module includes a random access memory (RAM), a page and bit register that forms part of the memory module mapping means, and a page address comparator for comparing a page address stored in the page and bit register with a page address used to address the memory modules. The memory circuit testing and configuration means further includes means for testing the page and bit register of each memory module.

Significantly, the memory circuit testing and configuration means also includes means for allocating a logical page of memory to a plurality of memory modules, including means for allocating each bit position to a separate memory module. The modules are selected from the pool of good modules. The memory circuit testing and configuration means further includes means for testing each logical page of allocated memory. The latter means includes, in turn, means for testing the page address comparator of each memory module assigned to the page. Each memory module also includes a multiplexer/demultiplexer for selecting from a plurality of data lines supplied from the global data bus, based on the bit position stored in the page and bit register. The means for testing each logical page of allocated memory further includes means for testing this multiplexer/demultiplexer.

In the illustrative embodiment of the invention, the memory modules are arranged in columns of n modules each, where n is a selected integer, and the columns are divided into m column groups, where m is an integer smaller than the number of bits in each data word. The number of data lines from the global data bus is divided as uniformly as possible among the m column groups, to reduce the complexity of data busing requirements. For example, there may be three column groups among which twenty-two bit positions are allocated, seven to each of two column groups and eight to the third column group. The multiplexer/demultiplexer has only to select one of seven or eight data lines in this configuration.

Preferably, the means for testing each logical page of allocated memory further includes means for testing the RAM in each memory module associated with the page. The memory circuit testing and configuration means further includes means for de-allocating a bit position from a memory module that has not passed a test, and reallocating the bit position to a different memory module selected from the pool of good modules.

The memory circuit testing and configuration means of the invention may further include means for de-allocating a complete logical page of memory that was previously allocated. This may be used, for example, if a page of memory has recurring error problems.

The present invention may also be defined as a method of automatically testing and configuring a large memory having a plurality of memory modules addressable by a logical memory address that includes a memory page address and a memory word address within the specified page. Basically, the method comprises the steps of preliminarily testing each of the plurality memory modules, establishing a pool of good memory modules based on the results of the testing step, and then allocating each logical page of memory to a plurality of memory modules selected from the pool of good modules. Allocating a page includes the step of allocating each bit position within data words in that page to a particular memory module. After allocation, each page of memory is associated with as many memory modules as there are bits within a data word. An additional step of the method is testing each logical page of memory to determine that the memory modules assigned to the page are fully operational.

More specifically, each memory module has a page and bit register for assignment of the module to a particular logical page and a particular bit position within each data word, and the preliminary testing step includes testing the page and bit register. The preliminary testing step further includes testing connections between the modules and the global data bus, and testing to determine whether each module is uniquely addressable.

The step of testing each logical page of memory after memory allocation further includes testing the page address comparator of each memory module assigned to the page, testing the RAM in each memory module assigned to the page, and testing the multiplexer/demultiplexer in each module of the page.

The preferred embodiment of the method also includes the step of selecting, in the multiplexer/demultiplexer of each memory module, one of the data bits assigned to a column group in which the memory module is located. A bit position field of the page and bit register is used to determine which of the data bits assigned to the column group is associated with this particular memory module.

When the step of testing a logical page of allocated memory detects errors in one or more memory modules, the method of the invention also includes the steps of de-allocating selected bit positions within the words of the page, based on the results of the testing step, and reallocating different memory modules to the same bit positions, selected from the pool of good modules. The method may also include the step of de-allocating an entire logical page of memory, if a complete page cannot be allocated from the pool of good modules or if the page cannot be repaired.

In the preferred embodiment of the invention, the step of allocating a logical page of memory is performed by selecting successive memory modules from successive columns of modules, such that the modules assigned to a particular page are distributed over as many module columns as possible.

It will be appreciated from the foregoing that the present invention represents a significant advance in the field of very large semiconductor memories. In particular, the invention provides for automatic testing and configuration of a large memory having multiple memory modules that are addressed by a logical addressing scheme. Other aspects and advantages of the invention will become apparent from the following more detailed description, taken in conjunction with the accompanying drawings.

DESCRIPTION OF THE PREFERRED EMBODIMENT

Figure 1:
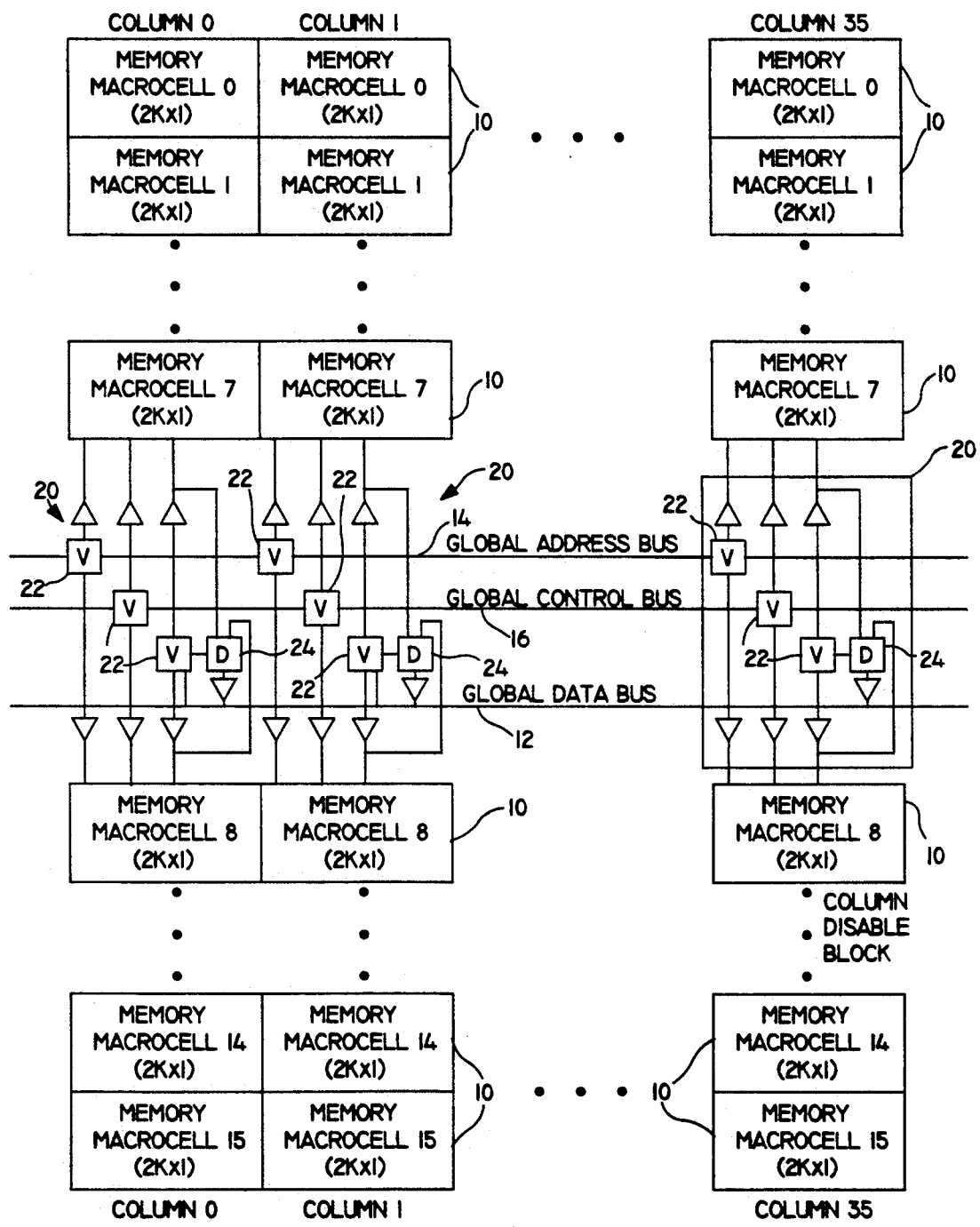
FIG. 1 is a block diagram of a large memory array arranged in accordance with the present invention.

As shown in the drawings for purposes of illustration, the present invention is concerned with apparatus and a corresponding method for testing and configuring a memory architecture in which each bit of each stored word is stored in a different physical memory module, to minimize loss of data when a memory module becomes damaged. Although this is a relatively simple concept, the task of configuring the memory, i.e. assigning memory modules to specific bit positions and page addresses, is a highly complex one, which, prior to this invention, has been performed by ancillary apparatus before installation of the memory.

In accordance with the invention, a large memory is provided with its own apparatus for testing and configuration. Thus, in the event of memory module damage while the memory is operative, testing and reconfiguration can be performed after first saving or discarding data stored in the memory. The environment in which the present invention operates is a large memory architecture. The architecture described is for purposes of illustration only, and it will be appreciated as the description proceeds that the invention may be readily modified to operate in conjunction with different memory architectures.

In general, all large memories of this type have multiple physical memory cells, which will be referred to as memory modules or memory macrocells. Each module is logically organized to have $1 \times N$ bits, where N is typically 2,048 or some other convenient number. The modules may be thought of as arranged in an array of rows and columns. A convenient data word size for a large memory is chosen, for example 22 bits, which include codes used for error detection and correction. Thus an array of 22 modules could be used to provide storage for 2,048 22-bit words, but would have no spare modules at all.

Description of the memory architecture

In the architecture to be described with reference to FIG. 1, there are 576 modules, indicated by reference numeral 10, arranged in thirty-six columns of sixteen modules each. The 22-bit data words in the memory structure are addressed by a 16-bit data address, divided into an 11-bit RAM address or word address and a 5-bit page address. The RAM address determines which bit of each 2,048-bit module is accessed for reading or writing data. One may consider the macrocells to be arrayed in three-dimensional space, with the columns and rows of modules extending in two dimensions and the 2,048 memory elements of each macrocell extending orthogonally in a third dimension. The 11-bit RAM address then determines the position of a "slice" through this three-dimensional memory structure. The page address identifies twenty-two specific modules within the array. These modules are used to store a data word specified by the page/RAM address, at the "slice" position specified by the RAM address. Finally, the bit assignments (0–21) in the data word must also be specified, so that each of the twenty-two modules making up a page is assigned to a unique bit position within each data word.

Configuration of the memory involves assigning each active memory module a unique combination of page number and bit position. Once these assignments are made, a memory write or read operation to or from a location specified by page and RAM address uses the page address to select an appropriate group of macrocells, uses the bit assignments to apply the individual data bits to their proper modules within the group, and uses the RAM or word address to select the appropriate bit slice in the modules.

The foregoing description tacitly assumes that each bit of a data word may be assigned to any macrocell in the array. For this to be true would require that data lines be bused to every module in the array. While this is desirable from the standpoint of having complete freedom to assign data bits to any desired modules, it is impractical from a design standpoint to run a data bus to every module in the architecture. A data bus this extensive would be subject to additional defects during fabrication and during operation. A compromise must usually be made to limit the extent of the data bus, at the cost of some limitation in complete freedom to assign bit positions to specific modules.

In the illustrative embodiment of the invention, a global data bus 12 extends row-wise through the center of the memory module array, dividing each column of modules into half-columns. Further, each set of three adjacent columns is defined as a separate entity referred to as a reticle. In this architecture, the first column in each reticle receives only seven data bit lines from the global bus 12, specifically bits 0–6 of the 22-bit data word. Similarly, the second column of modules in each reticle receives only eight bits, specifically bits 7–14 of the data word, and the third column in each reticle receives the remaining seven bits, specifically bits 15–21 of the data word. Therefore, in the illustrative embodiment, bit position assignments are limited in the sense that only bit positions 0–6 can be assigned to modules in columns 0, 3, 6, and so forth up to column 33. Similarly, only bit positions 7–14 can be assigned to columns 1, 4, 7, and so forth up to column 34, and only bit positions 15–21 can be assigned to columns 2, 5, 8, and so forth up to 35.

In addition to the global data bus 12, there is a global address bus 14 and a global control bus 16, which also run through the center of the array, between the half-columns of modules. The data bus 12, address bus 14 and control 16 extend through multiple column disable blocks 20 located between the half-columns of modules 10. The principal purpose of the column disable blocks 20 is to disconnect faulty column data lines from the global bus lines 12, 14, 16. In the presently preferred embodiment of the invention, the buses 12, 14, 16 are all triply redundant, i.e. there are three identical buses of each type, and the column disable blocks 20 include voter circuits 22. As will be further described, the column disable blocks 20 also include a disable register 24, which permits reading operations to selectively ignore data from the modules 10 in the event of a previously detected defect. The memory circuit also includes memory testing and configuration means 21, the functions of which are described below in detail with reference to FIGS. 5–21.

The global address bus 14 is connected, through the column disable blocks 20, to each of the half-columns of modules 10. Similarly, the global control bus 16 supplies control signals to each of the half-columns. The data bus 12 differs from the other global buses in that no more than eight data bits are connected to each column memory modules 10. Data bits 0–6 are connected to the first column in each reticle, bits 7–14 to the second column in each reticle, and bits 15–22 to the third column in each reticle.

Figure 2:
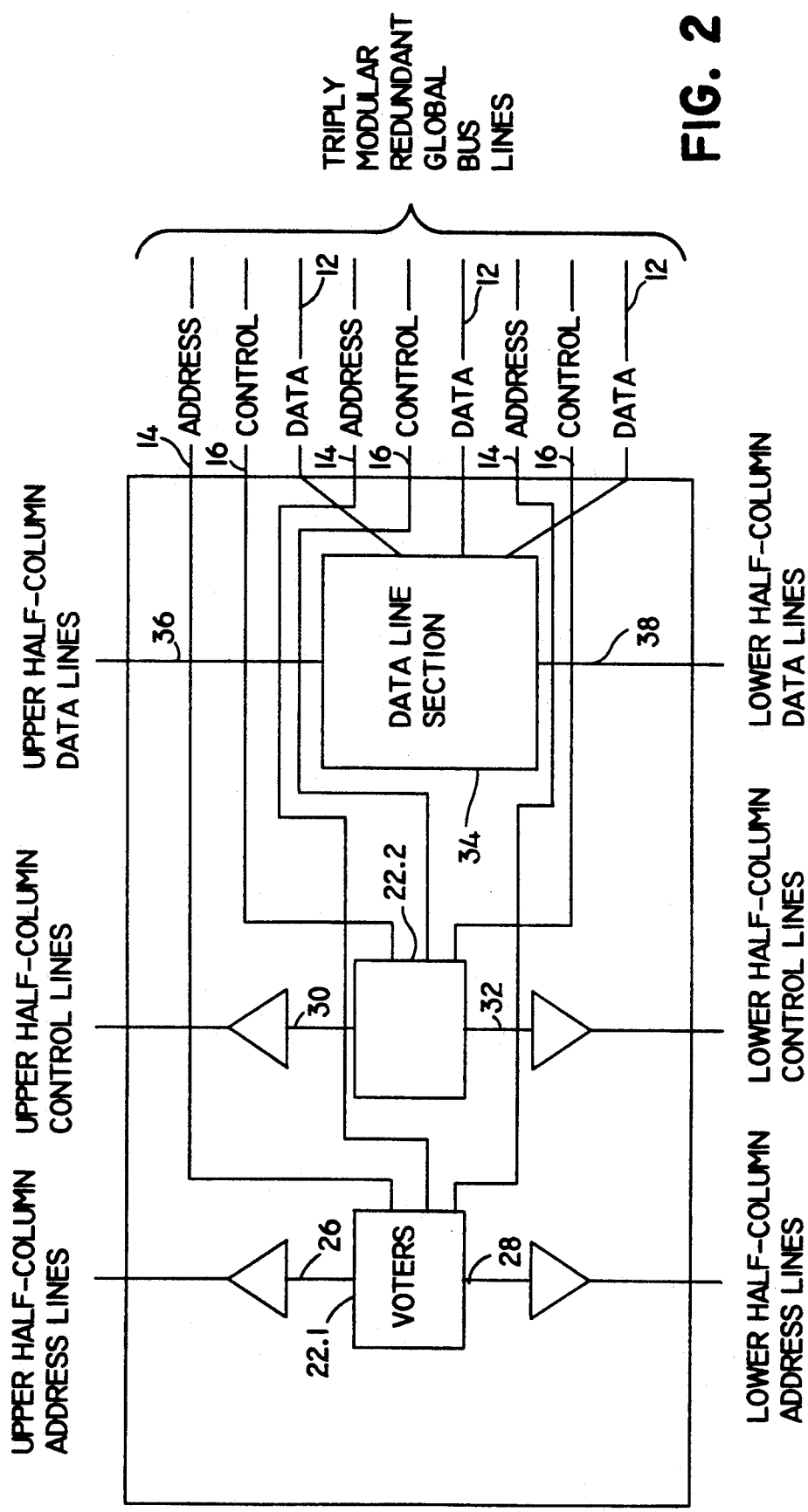
FIG. 2 is a block diagram of a column disable block used in each column of memory modules.

Each column disable block 20 includes, as shown in FIG. 2, an address bus voting circuit 22.1, which receives three usually identical signals on three lines of the global address bus 14, and outputs voted address signals on lines 26, 28 to the half-columns of modules to which the column disable block is connected. Similarly, three lines of the global control bus 16 are connected to an address voting circuit 22.2, from which voted outputs are supplied on lines 30 and 32 to the half-columns of modules. Three lines making up the global data bus 12 are connected to a data line section 34 of the column disable block 20, and this section (34) generates voted data signals on lines 36 and 38 to the half-columns of modules. The same lines 36 and 38 are used to read data from the modules onto the global data bus 12.

Figure 3:
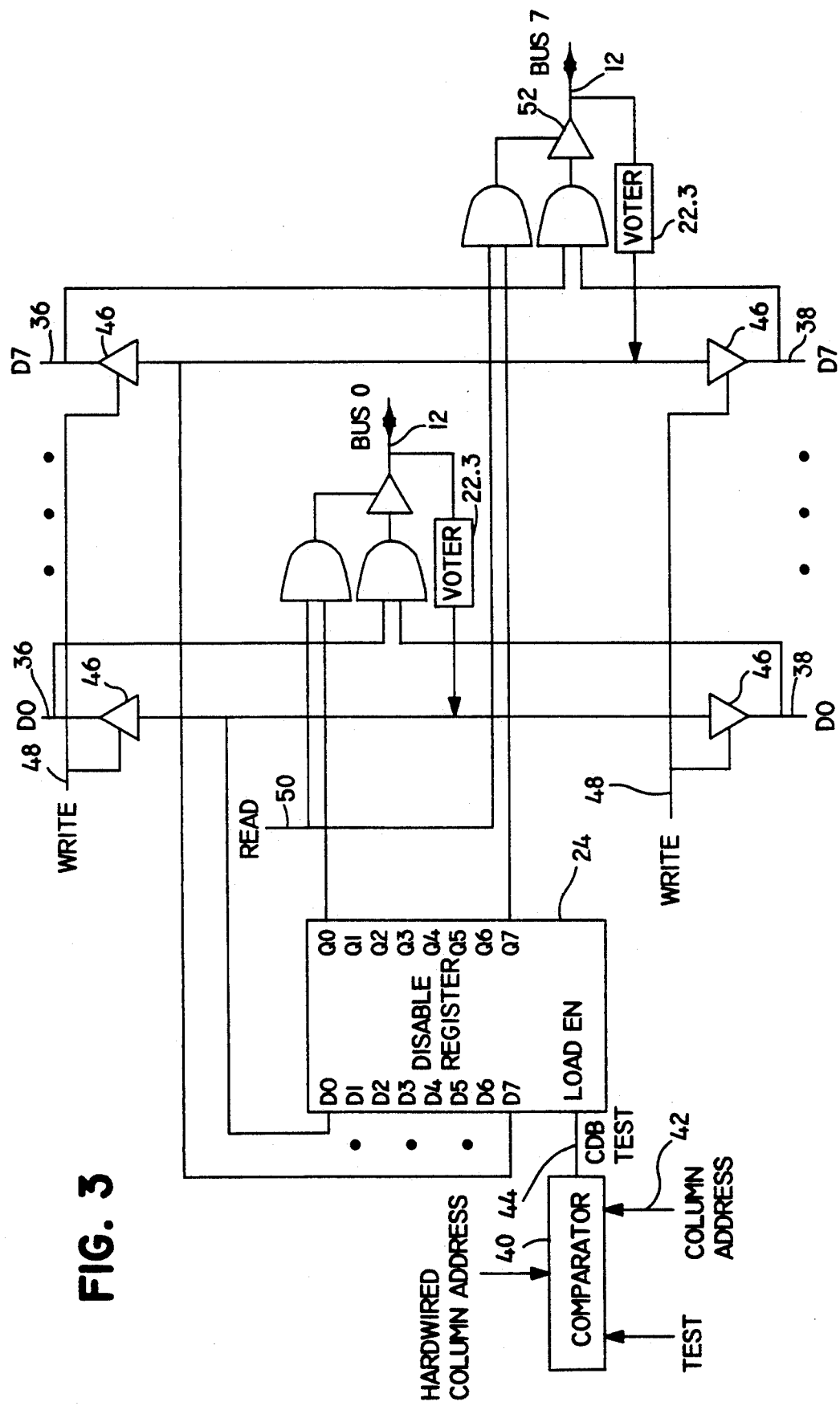
FIG. 3 is a block diagram of the data bus section of the column disable block of FIG. 2.

The data line section 34 of the column disable block 20, as shown in FIG. 3, includes the column disable register 24, voter circuits 22.3 for each of eight data bits, a comparator 40, and other logic to be described. The comparator 40 is used to compare a hardwired column address with a column address supplied over line 42. If a match is detected, an enabling signal is generated on output line 44, to enable the storing of data in the disable register 24 during operation in a column disable block test mode. During a write operation, from the data bus to the memory modules, data signals on the bus lines, two of which are shown at bit positions 0 and 7, are supplied to the voting circuits 22.3, and thence to output lines 36, 38 to the half-columns. Amplifiers 46 in the output lines are enabled by a write signal on line 48. Signals on the half-column address lines 26, 28 (FIG. 2) will determine which specific memory module will receive the data written onto the data output lines 36, 38.

For a read operation, a read signal on line 50 is ANDed with each of the eight output signals from the disable register 24, and the logical result is used to enable amplifiers 52 that connect the combined signals on lines 36, 38 onto the data bus 12. The specific manner in which the data line section 34 is implemented permits the signals read from lines 36 and 38 to be logically ANDed onto the data bus 12. Each line of the data bus 12 and each half-column data bus 36, 38 is pre-charged to a "high" state at the start of a read cycle. A line of the global data bus 12 is pulled to a "low" state only by the presence of a "low" data signal on one of the half-column data lines 36, 38 (with the simultaneous presence of a read signal on line 50 and a "high" signal from a corresponding bit position of the disable register 24). If a data bit being read from a memory module is a "high" state, both lines 36 and 38 will remain in the "high" state and the corresponding global bus line 12 will remain in the "high" state. If a "low" data state is read onto one of the lines 36, 38 and the other remains "high," the ANDing of the two signals will produce a "low" state and the corresponding global bus line 12 will be pulled to the "low" state, correctly reflecting the state of the data being read. Testing performed prior to operation of the memory ensures that there are no memory modules in a stuck-at-zero (low) condition.

During testing of the column disable block, the disable register 24 is selectively cleared to indicate which bit positions contain unreliable data. During the read operation, the disable register 24 functions to disable those bit positions.

Figure 4:
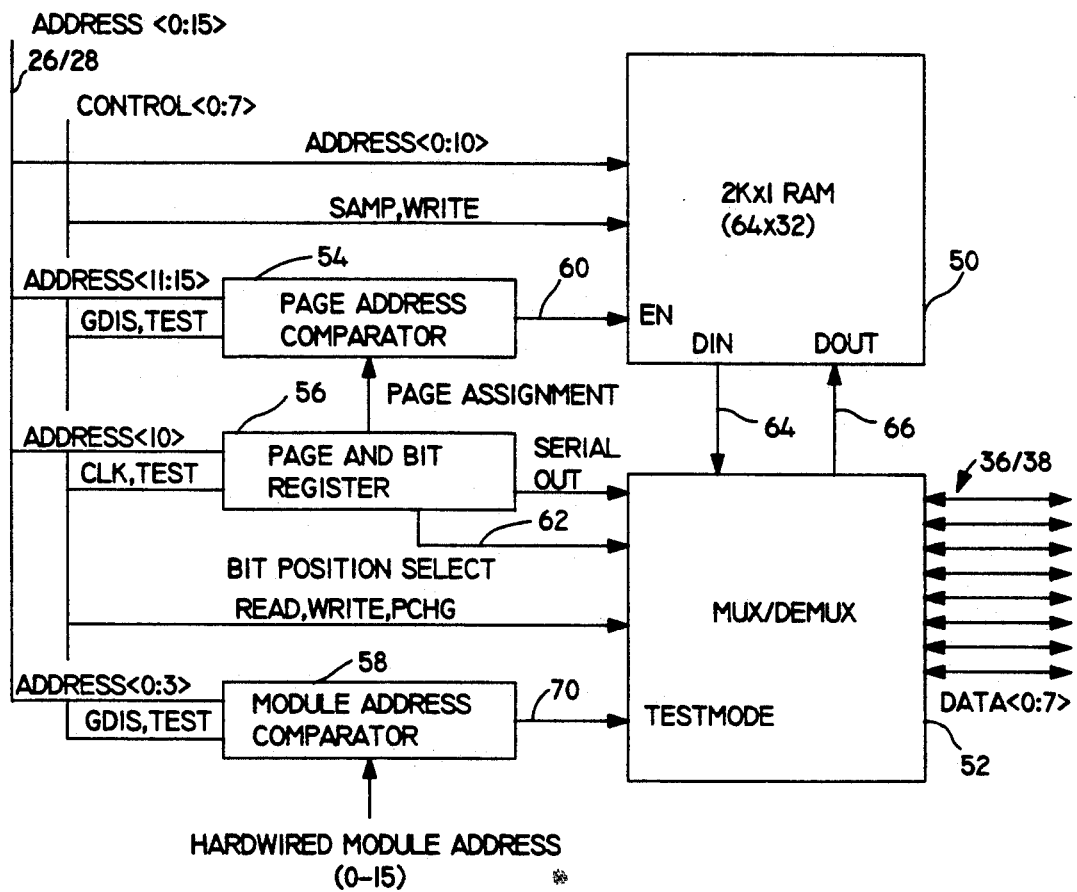
FIG. 4 is a block diagram of a single random access memory (RAM) memory module.

The principal components of each memory macrocell 10 are, as shown in FIG. 4, a random access memory (RAM) 50 of 2,048 × 1 bit, a data multiplexer/demultiplexer 52, a page address comparator 54, a page and bit register 56 and a module address comparator 58. Eleven bits of the address lines 26/28 are connected to the RAM 50 to control addressing in the eleven lower-order bits of the data address. Bits 11–15 of the data address contain the page address and are supplied to the page address comparator 54. In the operational mode of the module, page and bit position assignments have been stored in the page and bit register 56. The page address supplied to the module 10 is compared with the page address stored in this register and, if a match is found, an enable signal is generated on output line 60 from the page address comparator 54, to enable operation of the RAM 50. At the same time, the bit position assigned to this module is supplied over line 62 to the multiplexer/demultiplexer 52. The bit position signal, for which three bits are needed, determines which of the eight data lines 36/38 is selected for reading or writing operation on the RAM 50. Data input and data output lines 64, 66 connect the multiplexer/demultiplexer 52 with the RAM 50.

In operation, if the module is selected for use, i.e. if the page address of the module matches the page address in a requested memory operation, a selected data bit is written to or read from the RAM at a location determined by the lower-order bits of the requested memory operation. In a test mode of operation, page and bit position assignments are stored in the page and bit register 56. In the illustrative embodiment, one bit of the address lines 26/28 is used to input data serially to the page and bit register 56. Data bits previously stored in the register are output serially over line 68 to the multiplexer/demultiplexer 52. Operation in the test mode is controlled in part by the module address comparator. A hard-wired module (macrocell) address is compared with an address supplied over the address lines 26/28, and a match signal on line 70 indicates that the test mode is to be entered.

Overview of the test and configuration procedures

In accordance with the invention, a set of procedures conducts a series of tests on the bus system interconnecting the modules, and on the memory macrocells themselves. The procedures generate a map of the working modules, and configure them into pages of memory. Ancillary procedures allow for subsequent repair of the memory system.

Figure 5:
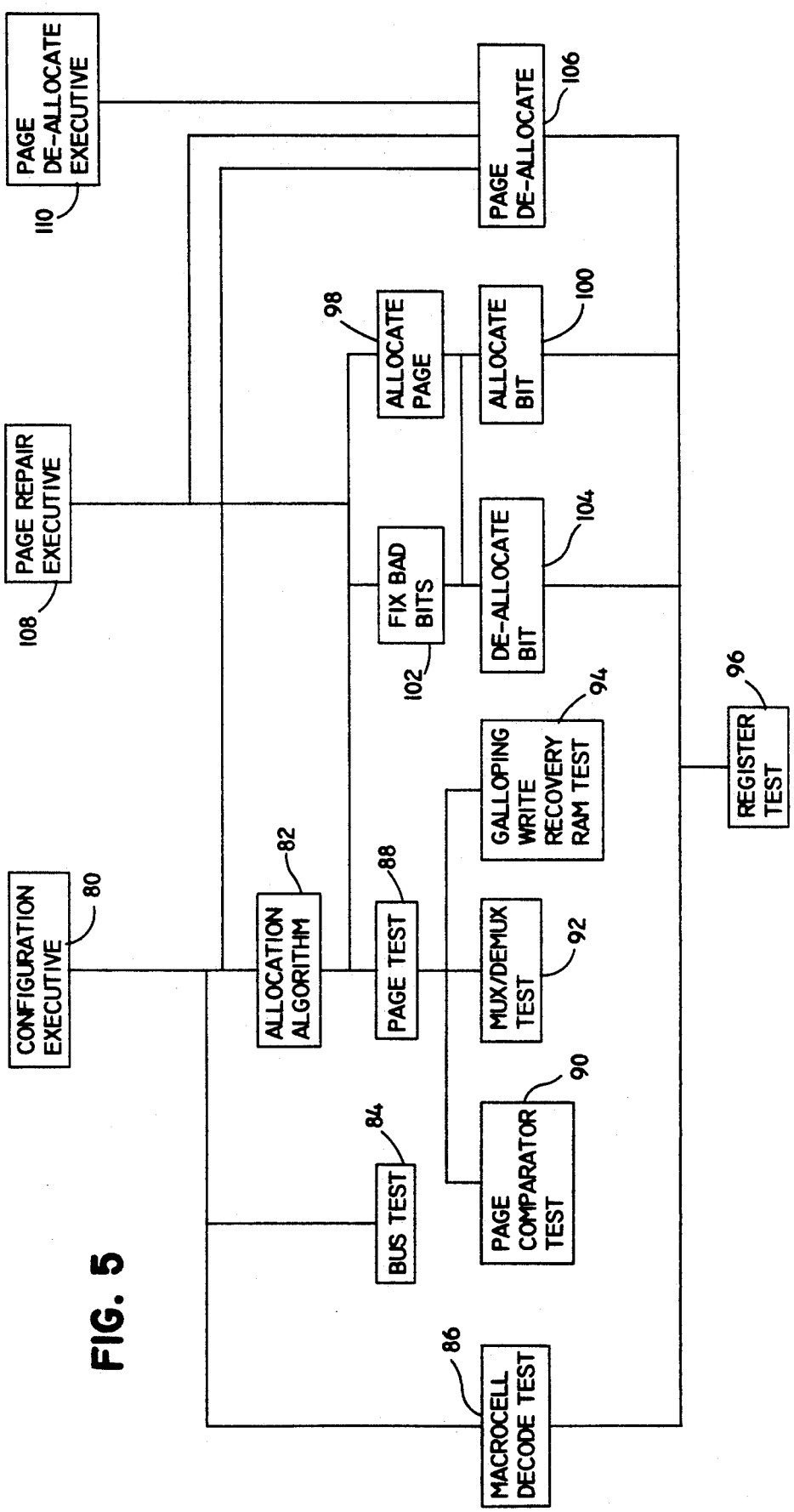
FIG. 5 is a block diagram showing a hierarchy of test and configuration procedures for operation on a large memory array in accordance with the present invention.

For convenience of design, and for ease of explanation, the test and configuration procedures of the invention are divided into a number of functional procedures, as illustrated in FIG. 5. These include a configuration executive procedure 80, which controls a sequence of operations using other procedures, including an allocation procedure 82, a bus test procedure 84, a module decode test procedure 86, and a page test procedure 88. The page test procedure 88 controls the operation of three dependent procedures, namely a page comparator test procedure 90, a multiplexer/demultiplexer test procedure 92, and a galloping write recovery RAM test procedure 94. Subsidiary test procedures include a register test procedure 96, an allocate page procedure 98, and allocate bit procedure 100, a fix bad bits procedure 102, a de-allocate bit procedure 104, and a page de-allocate procedure 106, Some of these subsidiary procedures also function under the control of two additional executive procedures: a page repair executive procedure 108 and a page de-allocate executive procedure 110.

Basically, the allocation and de-allocation procedures make use of page address codes stored in the page and bit registers 56 of each memory module 10. Special codes in the register indicate whether a macrocell is off because it is defective (referred to as "off;bad"), off but available for use (referred to as "off;good"), or on and assigned to a specified page (referred to as "on;page"). The page and bit registers also contain a bit assignment for each module that is on and assigned to a page. In the embodiment described, the page and bit registers are located in the modules themselves, but it will be understood that this information could instead be stored in the column disable blocks 20, or in some even more central module, rather than being distributed over all of the macrocells 10.

Figure 6:
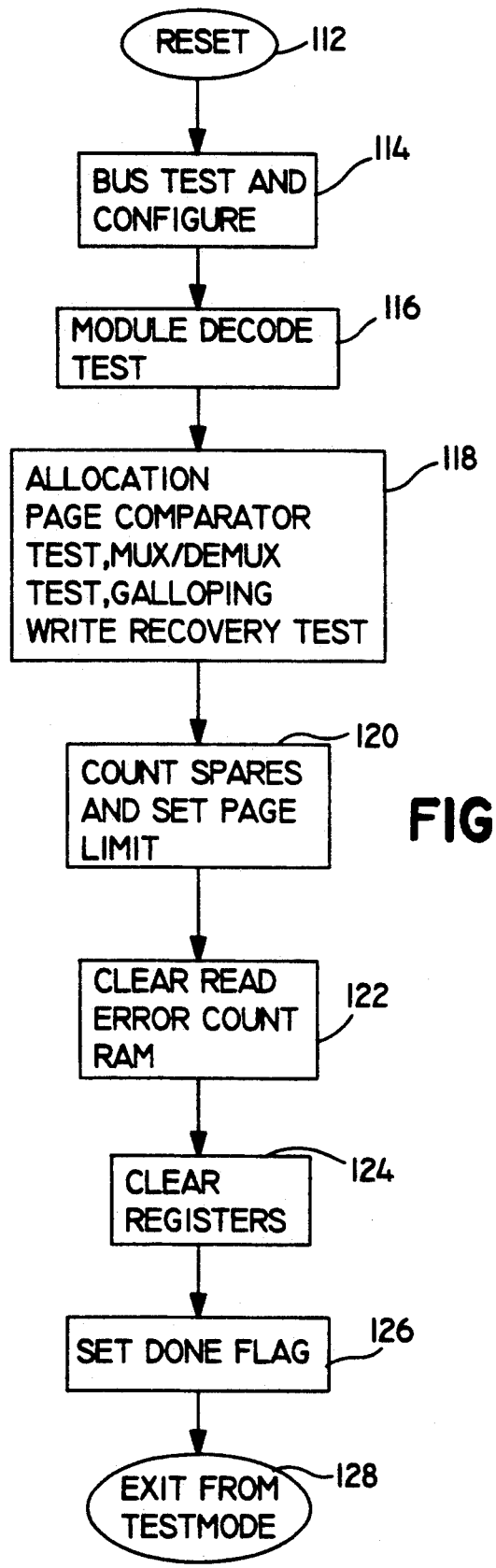
FIG. 6 is a flowchart of the configuration executive procedure.

An overview of the basic functional steps performed by the test and configuration procedures is provided by the flowchart of FIG. 6, depicting the configuration executive procedure. Entry to this procedure occurs upon the occurrence of a system reset, as indicated at 112. The most likely occurrence of a reset is as a result of power being applied to the memory architecture. In one embodiment of the invention, any of the test routines may be invoked on command if the memory architecture is in an appropriate mode.

The first step in the test procedure is to perform a bus test, indicated at 114, to test the global data buses. The column disable blocks 20 are used to circumvent faults due to bad memory modules or shorted or stuck column lines. The next test, indicated at 116, is a module decode test. As previously discussed, each memory module can be configured to respond to only one of eight data lines bused throughout a column of modules. The module decode test verifies that no module responds to more than one address. Otherwise a bad module is marked by storing a special code in its page and bit register. Once the module decode test procedure has been run, all modules contain assignments marking them as bad, or good and passed the module decode test.

The next major step is page allocation, the principal step performed in block 118. In this step an entire page of good memory modules, i.e. ones that have passed the module or macrocell decode test, is assigned to a page address. The allocation procedure attempts to distribute the chosen modules across different columns to minimize the power usage in each column. Once a page has been allocated, three tests are performed to verify its integrity: (1) the page comparator test, to verify that the page address comparator in each memory module responds only to the programmed page address and to no other; (2) a bit assignment test to check out the bit position assignment and the multiplexer/demultiplexer logic of each memory module, to make sure each bit can be stored uniquely; and (3) a comprehensive RAM test to check the address decoding and dynamic switching characteristics of the RAM of each memory module. The multiplexer/demultiplexer test only checks the module's circuitry for the bit position to which it has been assigned.

If any of these tests fail, the page is repaired by finding the modules assigned to the failing bit positions, marking these modules as bad and having failed the page tests, then searching through the memory array for replacement modules and assigning the replacements to this page, after which the page can be retested. If the allocation procedure is unable to find replacement modules after scanning the array twice, it assumes that no more modules are available, and de-allocates the good modules from the last incomplete page into a pool of spares, by marking them as good and having passed the module decode test. The configuration executive the performs some housekeeping functions: counting the spare macrocells and setting a page limit (block 120), i.e. storing the highest page address configured successfully, clearing a read error count RAM 122 (not used until the operational mode is entered), clearing some registers 124 (also not used until the operational mode is entered), and setting a flag (block 126) to signal that it has completed the self test. Then, as indicated at 128, the procedure returns to the normal operating mode.

Bus test and configuration

The purpose of the bus test and configuration procedure is to make sure that only columns with good buses are connected to the global data bus. Column data lines with faults are disconnected from the global data lines by means of the column disable register 24. Errors detected by this procedure include hard errors whereby lines are "stuck" in a zero condition, and modules that output data on column data lines when in the "reset;off" state.

Figure 7:
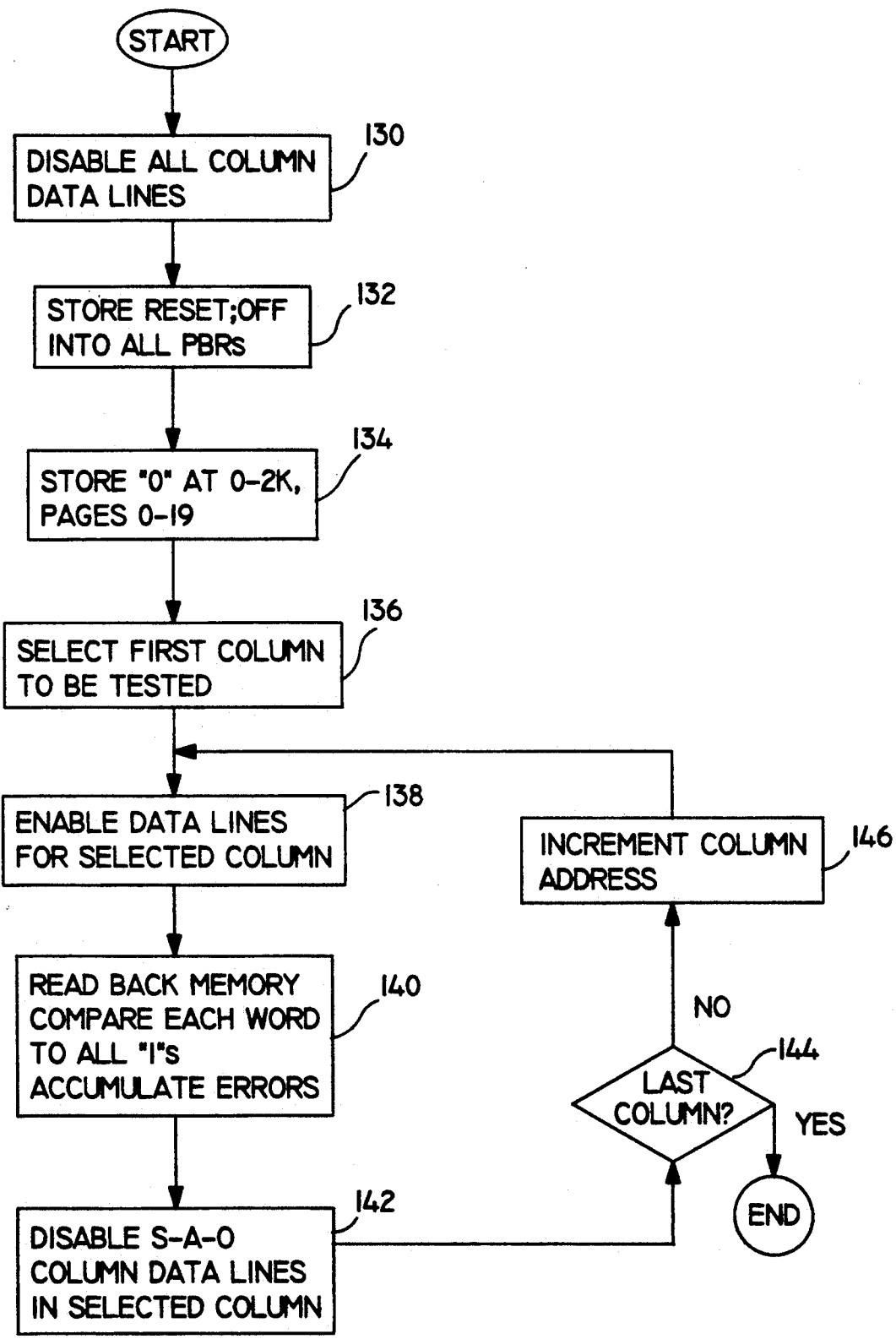
FIG. 7 is a flowchart of the bus test and configuration procedure.

The first step in the procedure, as shown in FIG. 7, is to disable all column data lines by clearing the column disable registers 24 for each column, as indicated in block 130. Then, at block 132, a reset;off code is stored into each of the page and bit registers 56, and zero is stored into all memory locations (block 134). In the reset;off condition, there should be no output read from the memory modules. At the start of a read cycle, each half-column data bus line and each global data bus line is precharged to a "high" or logical "1" state. If a read operation detects a "low" or logical zero condition, the corresponding data line is pulled low to a logical zero state. If this happens when the entire memory is in the reset;off state, it is an indication either that a column data line is stuck in a zero condition, or that a module is improperly outputting its zero data even though in the reset;off state.

The first column to be tested is selected (block 136), data lines are enabled for the selected column (block 138), and the memory is then read back in that column (block 140). If all 1's are not read back, any errors are noted, and column data lines are selectively disabled (block 142). In other words, a zero is stored in the column disable register, at a bit position corresponding to the bit position at which a zero was read back from the column data lines. Then the column number is incremented until all columns have been tested (blocks 144, 146).

Module decode test

The purpose of this test is to verify that each memory module responds to one unique address, and that it passes the register test. Another special code, "reset;untested," is loaded into all of the modules (block 150, FIG. 8a). In general terms, the procedure first performs the register test on a reference or test module. If it passes, the reference module is loaded with a test value. If another module, referred to as an index module, is found to contain the test value, a flag is set and the index module is loaded with the reset;off code. The test is continued until all other index modules have been checked. If the flag was set during this procedure, the reference module is loaded with reset;off. Otherwise it is loaded with another code, reset;mdt, indicating the module under test has passed the module decode test.

Figure 8A:
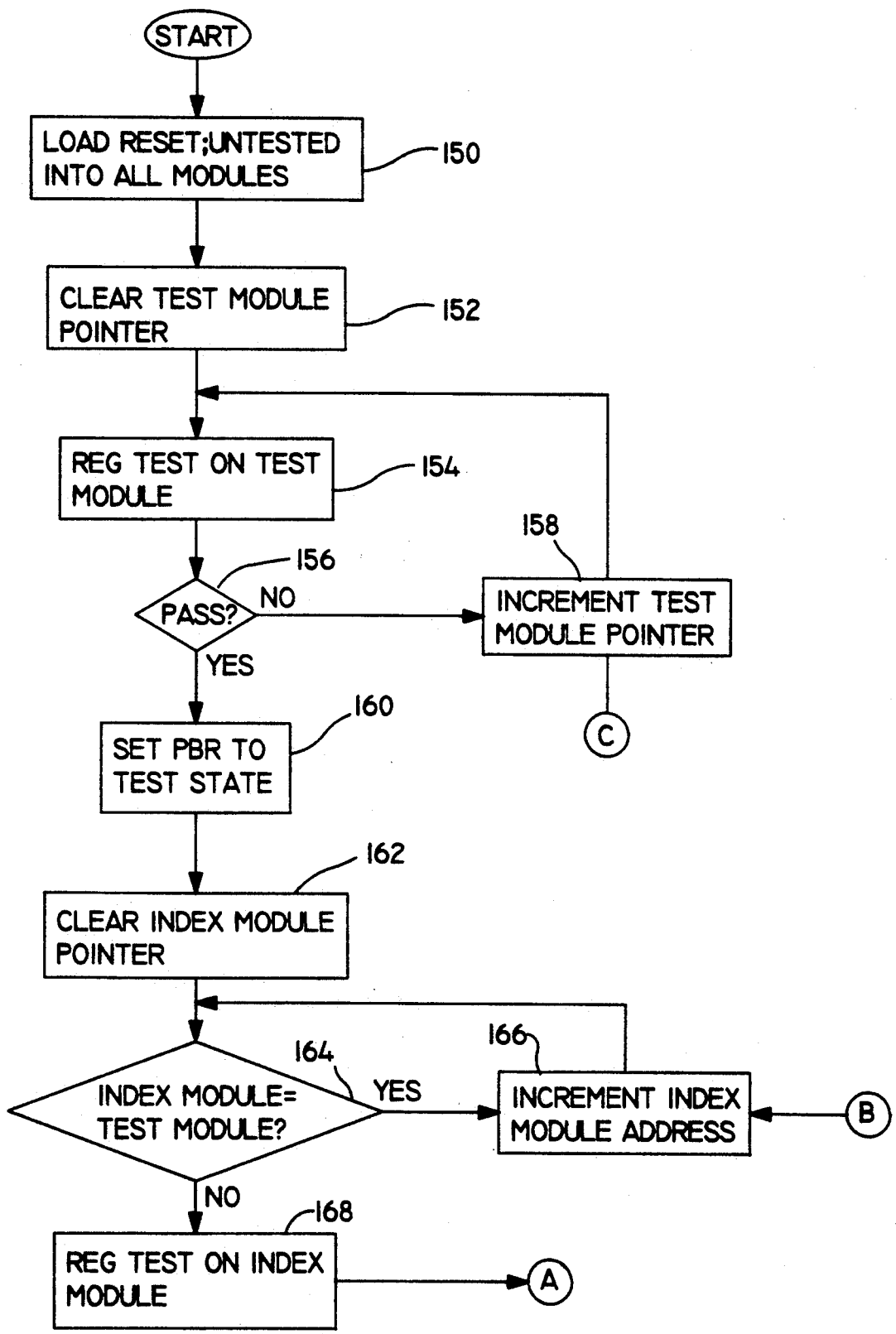
FIGS. 8a and 8b are together a flowchart of the module decode test procedure.
Figure 8B:
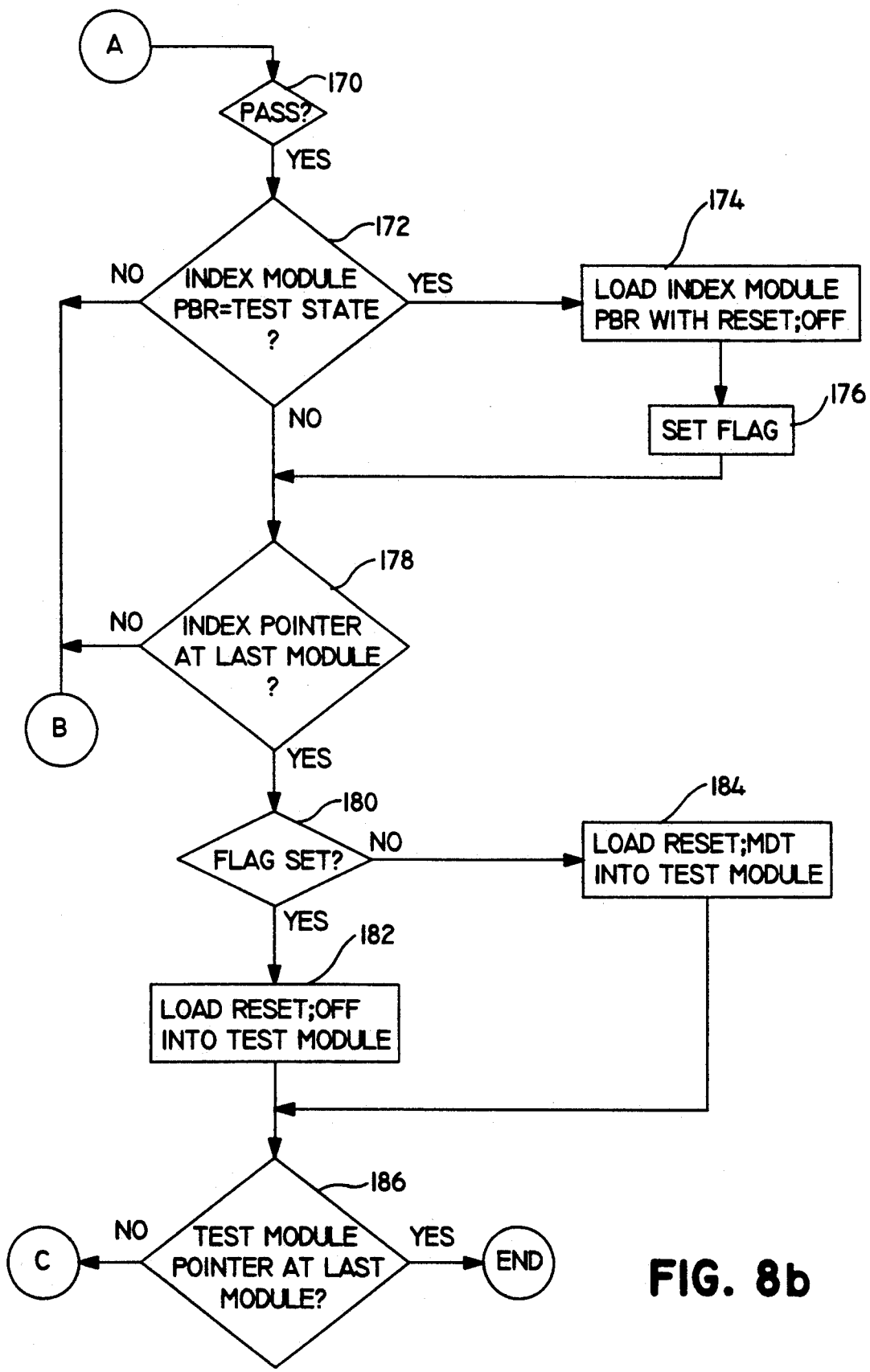

As shown in FIG. 8a, a test module pointer is cleared at the beginning of the procedure (block 152); then the register test is performed on the test module (block 154). If the test is not passed (block 156), the test module pointer is incremented (block 158) and another test module is tried, until one is found that passes the register test. Then the page and bit register in the test module is set to a special test state (block 160) and an index module pointer is cleared (block 162). A test is made in block 164 to determine if the index module is the same as the test module, in which case the index module pointer is incremented (block 166) before proceeding. Then the register test is performed on the index module (block 168). If the index module does not pass the register test (block 170), return is made through connector B to block 166, to increment the index module pointer.

If the index module passes the register test, its page and bit register is checked to see if contains the same test state that was stored in the page and bit register of the test module (block 172). If so, the index module is loaded with the reset;off code (block 174) and a flag is set (block 176). If not, the latter two steps are not performed, and the index module pointer is checked, in block 178, to determine of all modules have been checked. If not, processing continues at block 166 (via connector B), where the index module pointer is incremented and the next index module is tested.

After all of the index modules have been tested, the error flag is checked (block 180). If it is set, a reset;off code is loaded into the test module (block 182). If the flag is not set, a reset;mdt code is loaded into the test module (block 184). Then the test module pointer is checked (block 186) to see if all modules have been used as the test module. If not, return is made, via connector C, to block 158, where the test module pointer is incremented and the whole sequence is repeated for another test module. At the end of the procedure, each module has been tagged as either reset;mdt, meaning that it has passed the module decode test, or reset;off, meaning that it has failed.

Register test

The register test procedure checks that a specified module's page and bit register function correctly, and that the module address comparator and I/O multiplexer/demultiplexer also function correctly. In the procedure, a test pattern is written into the module's page and bit register using bit #10 of the address lines to the module. The old value stored in the register is read out onto the data bus. If the old value is the reset;off code, it is reloaded into the register and the test is considered to have failed. If the old register value was not the reset;off code, it is written back into the register and the test pattern is read out. If the test pattern is correct, the module is deemed to have passed the register test. Otherwise, the reset;off code is written to the register.

Figure 9:
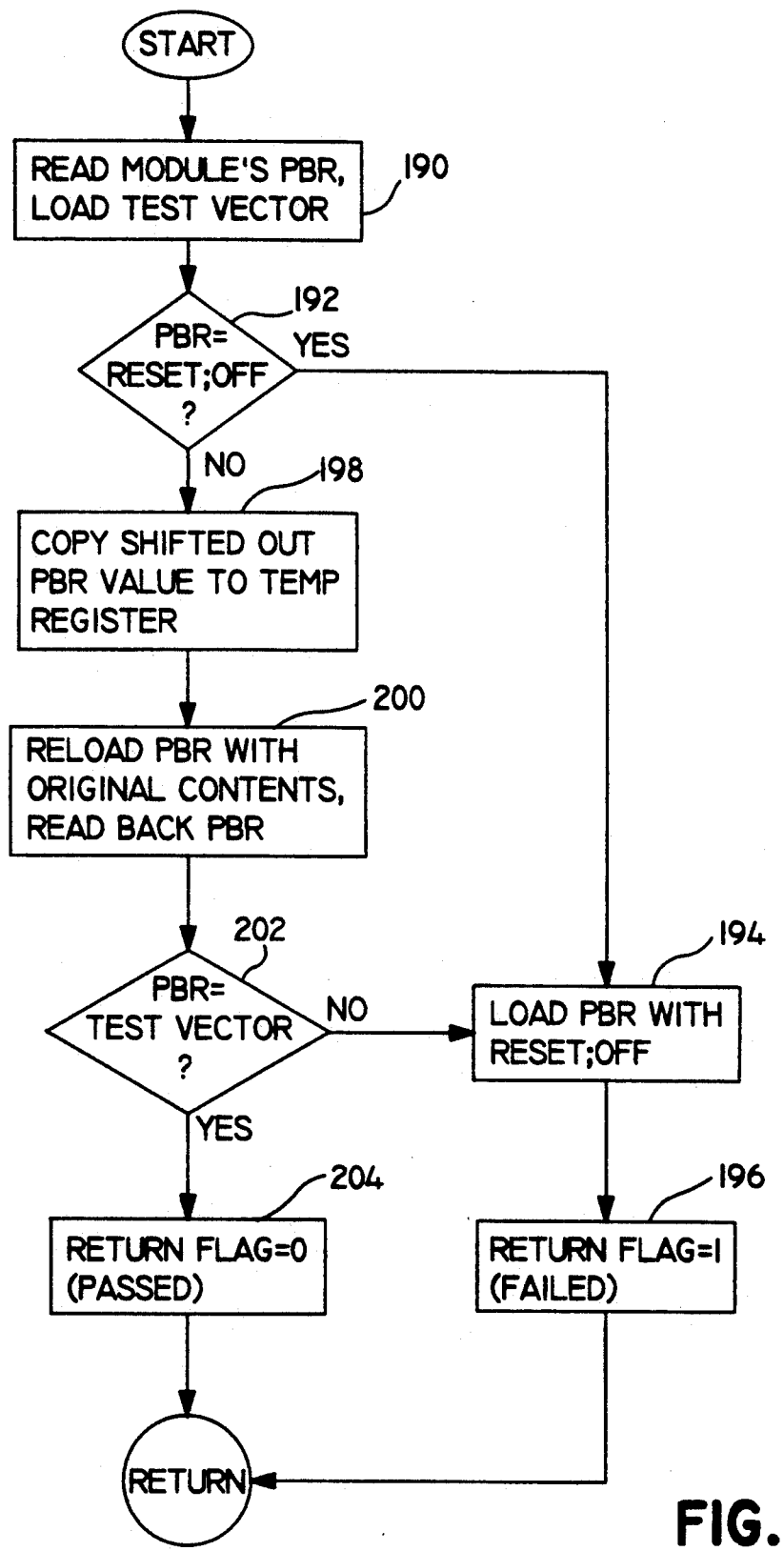
FIG. 9 is a flowchart of the register test procedure.

The procedure is shown in flowchart form in FIG. 9. In block 190, the module's page and bit register is read out and the test value is written in. If the retrieved value is reset;off (block 192), the page and bit register is loaded with the reset;off code (block 194) and a return flag is set (block 196) to indicate that the test was failed. If the retrieved content of the page and bit register is not reset;off, its value is saved (block 198), and reloaded back into the register (block 200), at the same time as retrieving the test pattern that was written to the register. If the retrieved test pattern is correct (block 202), a return flag is cleared (block 204) to indicate that the test was passed.

Allocation procedure

Figure 10:
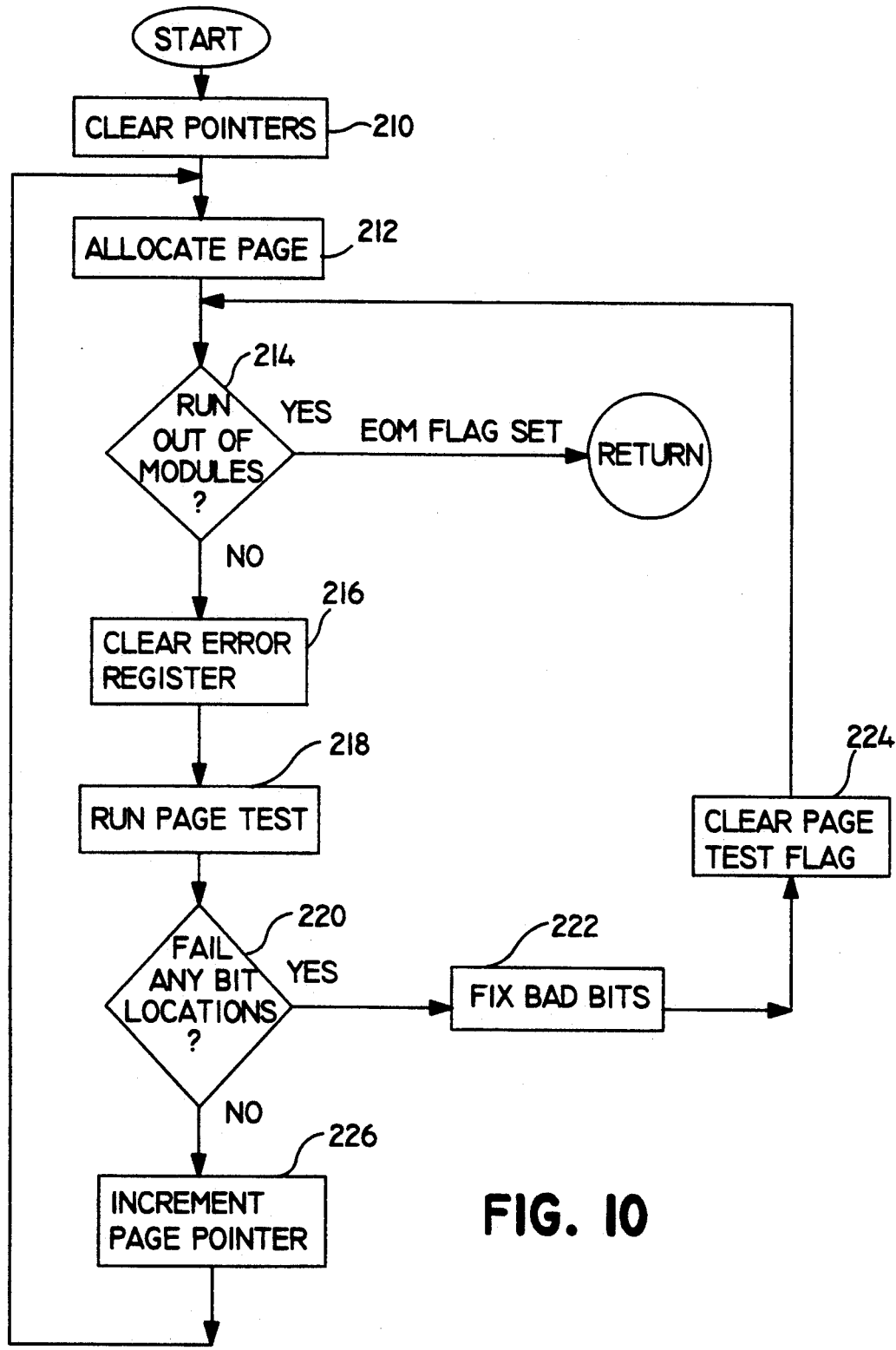
FIG. 10 is a flowchart of the allocation procedure.

As shown in FIG. 10, the allocation procedure calls on a number of other procedures in allocating memory. First, various pointers are cleared (block 210), and a page of memory is allocated (212), as will be described in more detail. If there are no more modules to allocate (as determined in block 214), a return is made from this procedure, as shown, with and end-of-memory (EOM) flag set to indicate one pass through the entire memory array has been completed. If a module is available, an error register is cleared (block 216), and a page test is run (block 218). If the page test results in any bit positions showing as failed (block 220), the bad bits are "fixed" (block 222), a page test flag is cleared (block 224), and return is made to block 214. If there are no failed bit locations in the page, a page pointer is incremented (block 226), to indicate the current page of memory being tested, and return is made to block 212 to allocate the next page.

Figure 11:
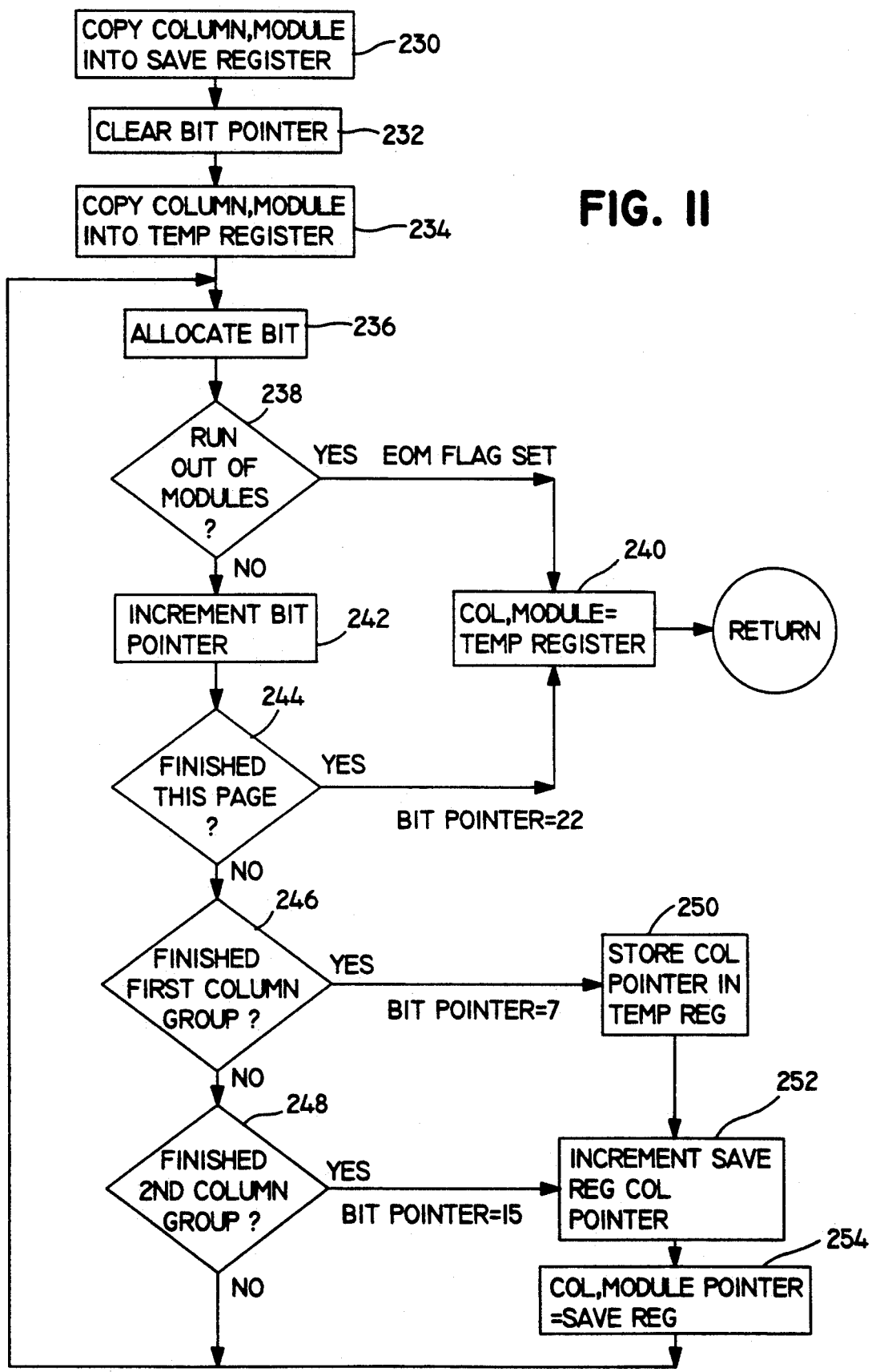
FIG. 11 is a flowchart of the page allocation procedure.

Page allocation (block 212) is shown in more detail in FIG. 11. First, olumn and module pointers are saved in a register (block 230), a bit pointer is cleared (block 232), and reference copies of the column and module values are also stored in a temporary register (block 234). Next, the page allocation procedure invokes a procedure to allocate a bit (block 236). If the allocation procedure has run out of modules (block 238), the column and module pointers are restored (block 240), and a return is made from the page allocation procedure. If not, a bit pointer is incremented (block 242). If the page is finished, i.e. all 22 bits have been successfully allocated, as determined in block 244, return is made from the page allocation procedure after first restoring the column and module pointers (block 240). If not, it is next determined whether the first column group of the page is finished (block 246). If not, and if the second column group is not finished either (block 248), the procedure returns to block 236 to allocate another bit. This loop continues until all of the first column group has been allocated, at which time a column pointer is stored in the temporary register (block 250), and the column pointer is incremented (block 252). Then the column and module pointers saved in the first step of the procedure are restored (block 254) and the procedure continues at block 236 with the allocation of bits in the second column group. When the second column group is finished (block 248), the procedure continues at blocks 252 and 254 and then returns to block 236 to allocate bits for the third and last column group.

Figure 12:
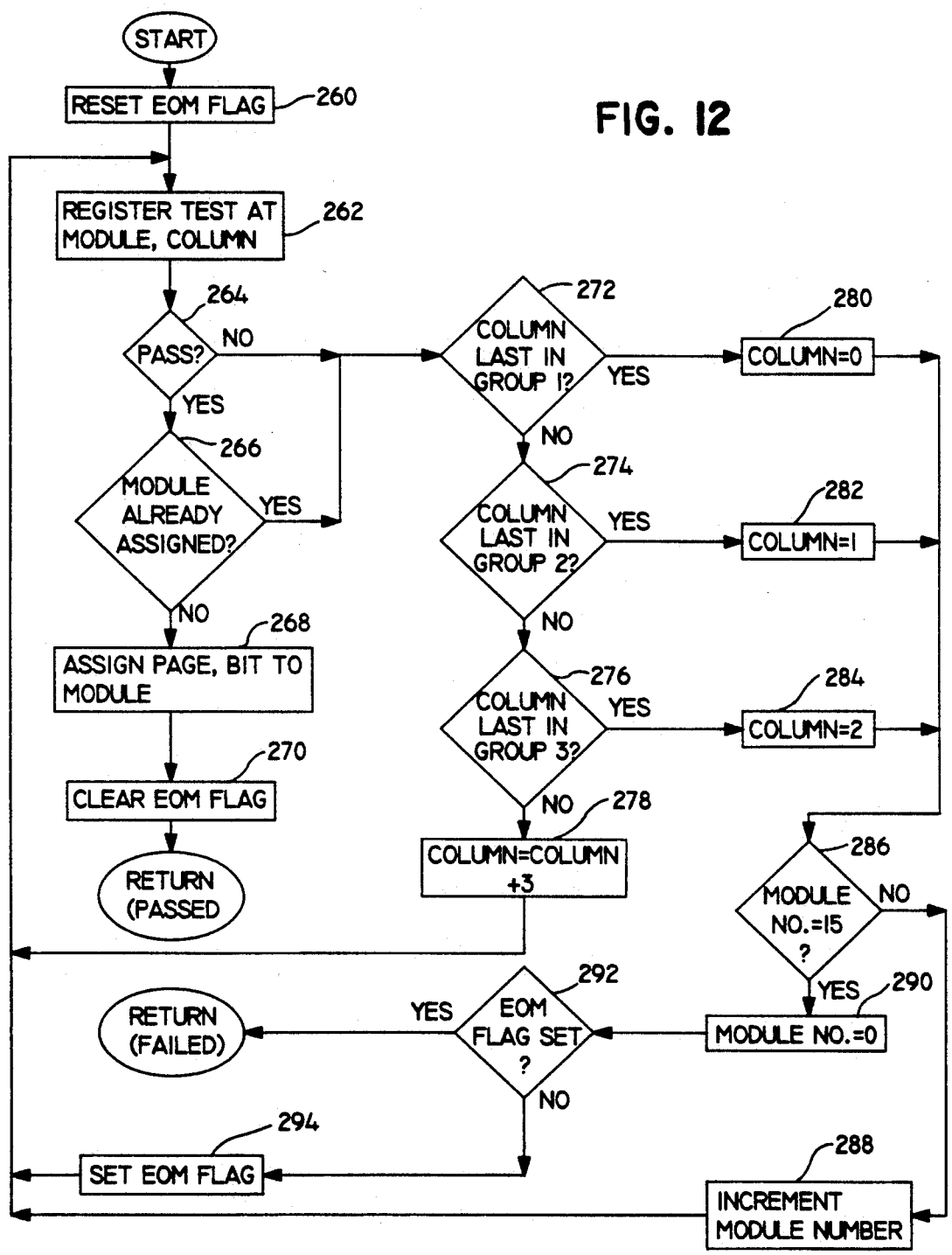
FIG. 12 is a flowchart of the bit allocation procedure.

The procedure for allocating a bit is shown in FIG. 12. Basically, the procedure begins scanning the array of modules at point given by the module and column numbers on entry to the procedure. It searches for the first good module by scanning in a row-wise direction, skipping columns three at a time. It will be recalled that the columns are arranged in three column groups, and that a particular bit position can be assigned to just one of those column groups. Therefore, only one column group of modules is scanned, but according to the procedure the entire memory array is scanned to its end twice before the end-of-memory (EOM) flag is set. Thus each module is scanned at least once.

As shown at block 260, the EOM flag is first cleared on entry to the procedure. Then a register test is performed (block 262) on the module defined by the current module and column numbers. If the test is passed (block 264), and if the tested module is not already assigned (block 266), the page and bit number is assigned to this module (block 268), the EOM flag is cleared (block 270), and a return is taken indicating that the bit has been allocated as desired.

If the register test is not passed (block 264) or the module is already assigned (block 266), the procedure has to scan and test other modules to find one that can be allocated. To begin this process, the procedure first determines if the column is the last one in a column group, as shown in blocks 272, 274 and 276 for the three column groups. If the column is not the last one in a group, the column number is increased by three, to index it to the next column in the group (block 278), and return is made to block 262 to perform a register test on the next candidate module. If any of the tests in blocks 272, 274, 276 determines that the last column in a column group is being processed, the column number is set back to the first column number of the group (blocks 280, 282, 284) and the module number is checked (block 286) to determine if the maximum module number (15) has been reached. If not, the module number, i.e. the row number, is incremented (block 288), and the process is started again at block 262, to look for a good module on the next row. If the module number reaches the maximum (15 in the illustrative structure), the last row has been scanned and the module number is reset to zero (block 290). If the EOM has been set already (block 292), a return is taken indicating a failure to allocate a bit because no good module has been found.

On a first pass through this procedure, the test for EOM in block 292 will find the EOM not set, in which case it will be set (block 294) and processing will continue in block 262, effectively beginning another scan of the modules at the first row again. Blocks 292 and 294 ensure that the modules in a column group will be scanned to the last row twice before a "failed" return is taken from the procedure.

Page test

Figure 13:
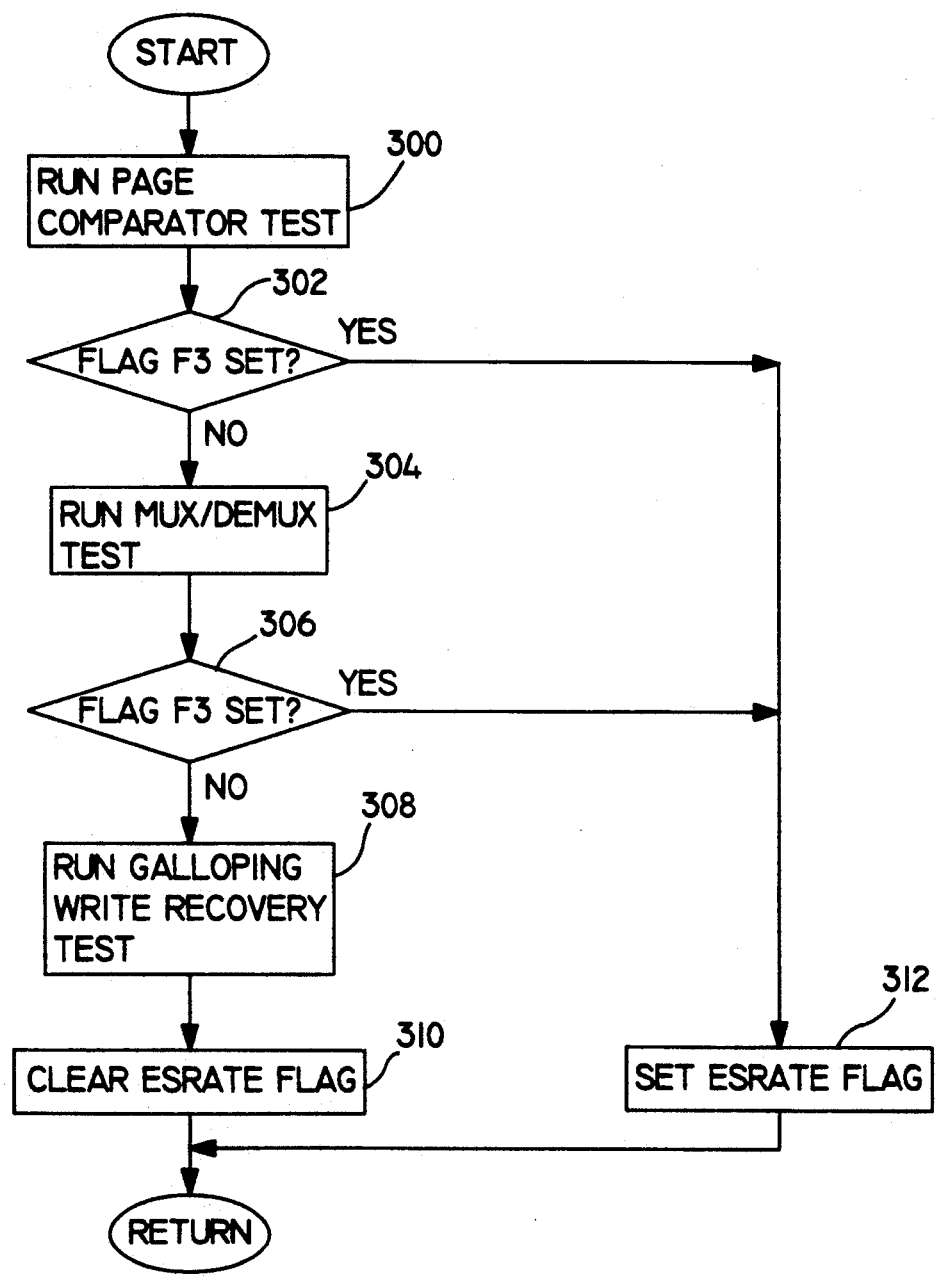
FIG. 13 is a flowchart of the page test procedure.

Once the allocation procedure (FIG. 10) has allocated a page, it runs a page test procedure (block 218), which is shown in more detail in FIG. 13, and tests the entire page of memory. Basically, the page test encompasses three separate tests: the page comparator test, the multiplexer/demultiplexer test, and the galloping write recovery test. As shown in FIG. 13, the page test first runs the page comparator test (block 300); then checks a flag referred to as the F3 flag (block 302), which may have been set by the page comparator test procedure in the event of detected errors. If the F3 flag is not set, the MUX/DEMUX test is run (block 304) and the the F3 flag is again checked (block 306). If the flag is not set, the galloping write recovery test is run (block 308), and an error flag is cleared (block 310) before leaving the procedure. If errors are found in either the page comparator test or the MUX/DEMUX test, the error flag is set (block 312) before leaving the procedure.

Page comparator test

Figure 14A:
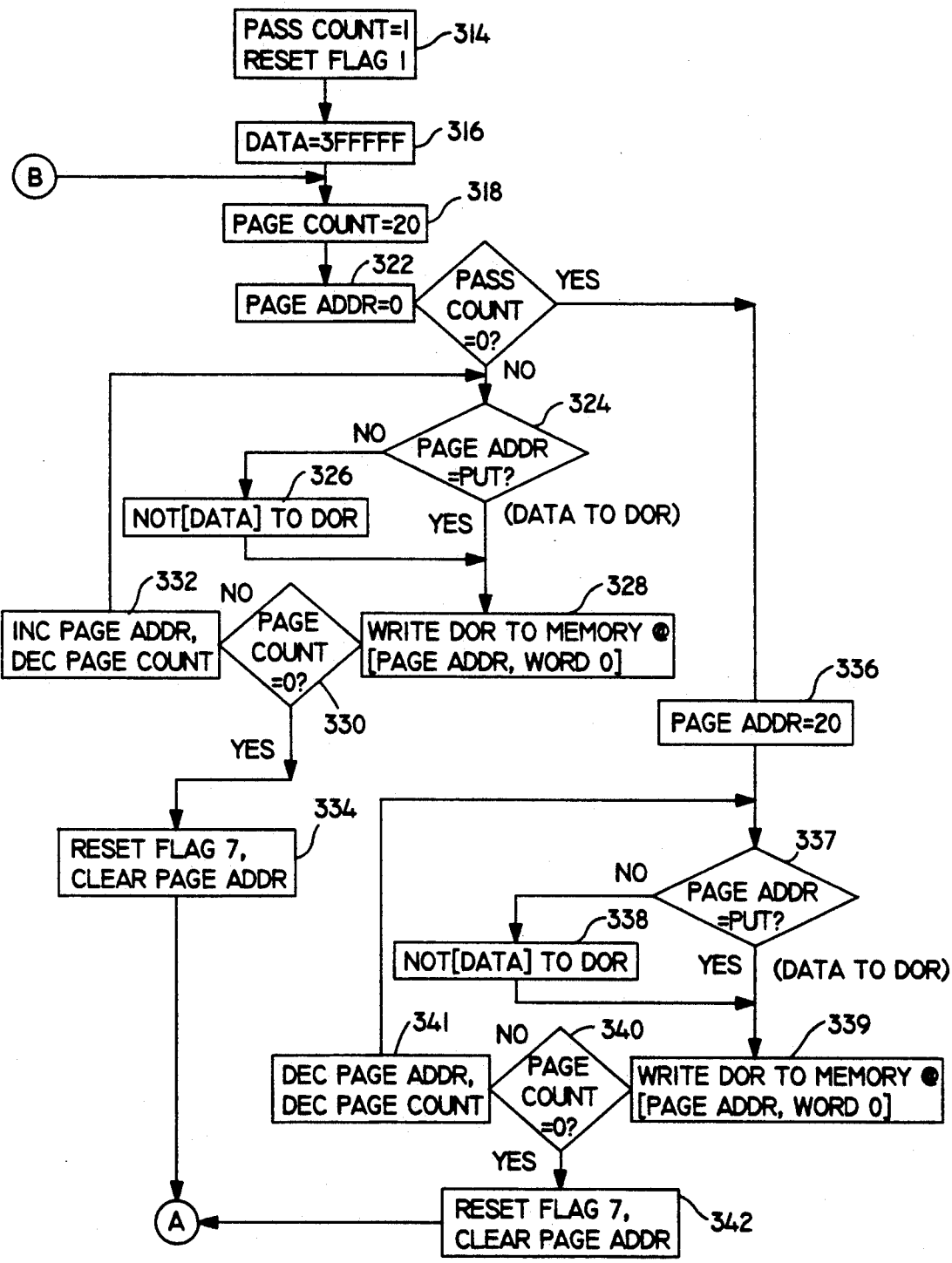
FIGS. 14a and 14b are together a flowchart of the page comparator test procedure.
Figure 14B:
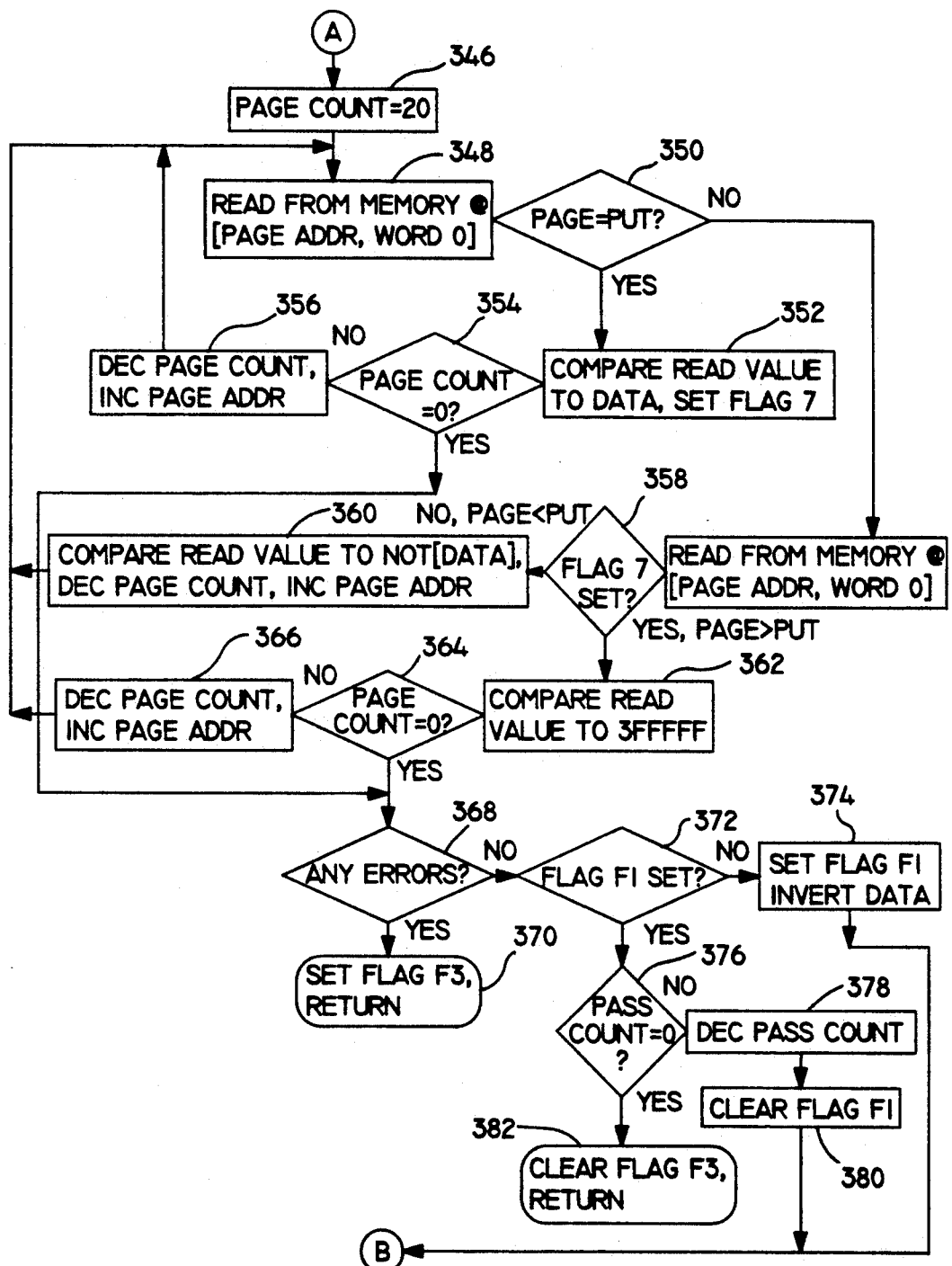

Detail of the page comparator test is shown in FIGS. 14a and 14b. FIG. 14a shows the write tests performed on the page comparator and FIG. 14b shows the read tests. In brief, the page comparator test verifies that the page address comparator 54, the multiplexer/demultiplexer 52 and a single word of RAM 50 work at the allocated page address, that no other pages respond to this address, and that the memory modules of the page under test only respond to this page address. These checks are made in an increasing and decreasing page address order.

First, as shown in FIG. 14a, a pass count is set to 1 and a flag F1 is cleared (block 314), and a data word is set to all 1's (block 316). Then a page count is initialized at 20 (block 318) and a page address at zero (block 320). The pass count is checked (block 322), and on the first pass the page address is checked to determine if it is page under test (PUT), as shown in block 324). If it is, the data word, which was originally all 1's, is stored in a data output register. Otherwise, the data word is complemented before storing in the data output register (block 326). The data output register is then written to memory at the specified page address, and a word address of zero (block 328). Unless the page count has been decremented to zero (block 330), it is decremented by one, and the page address is incremented by one (block 332). The loop containing blocks 324, 326, 328, 330 and 332 is repeated until the page count is reduced to zero, writing all 1's to the page under test, and all 0's to the other pages. At the end of this cycle, a flag F7 is reset and the page address is cleared to zero again (block 334), after which processing continues in FIG. 14b, via connector A.

On a subsequent pass through the procedure of FIG. 14a, blocks 336–342 perform a series of write operations in which all 0's are written to the page under test, and 1's are written to the other pages.

The read test of FIG. 14b reads data words that have been written in the immediately preceding pass of the write test of FIG. 14a. First, the page count is set to 20 (block 346), and there is a read from memory at the page address specified and word zero (block 348). The comparisons next performed depend on whether the page from which the current read was made is the page under test, as determined in block (350). If so, the value read from memory is compared with the data word written to memory (block 352) and errors are noted. Also the F7 flag is set, to indicate on subsequent passes (with higher page numbers) that the page number is greater than the page under test. If the page count is not zero (block 354), the page count is decremented and the page address is incremented (block 356. Further reads from memory are made in the next page (block 348) and the processing cycle continues.

For pages that are not the page under test (block 350), a check is made of flag F7 (block 358) to determine whether the current page number is greater than or less than the number of the page under test. If the answer is "less than," the value of the read data is compared to the complement of the data word (block 360), the page count is decremented and the page address is incremented, before continuing with processing in block 348. If the page number is greater than that of the page under test, there will be no memory modules assigned to the page and data read back should be all 1's. Thus, in block 362 the data read is compared with all 1's (block 362), and the page count is checked, in block 364. If the page count is not zero, it is decremented and the page address is incremented (block 366) before continuing processing at block 348.

When reads have been done on all pages, as determined in either of the page count tests at 354, 364, if any errors have been detected (block 368) the F3 flag is set (block 370) and a return is made from this procedure. If there are no errors, flag F1 is checked (block 372). It was originally cleared at the start of the write test (block 314). When detected as not set in block 372, flag F1 is set and the data word is inverted (374), before continuing processing with the write test, via connector B. The procedure therefore makes another "first" pass through the write test, but with inverted data. On its next pass through the read tests, the procedure will find flag F1 set (block 372), and will next check the pass count (block 376). If the pass count is still one (the first pass), it will be decremented to zero (block 378) and flag F1 will be cleared (block 380) before returning to the write test for a second pass. On the next pass through the read test, the F1 flag will still be cleared, so the F1 flag will be set and the data inverted again (block 374). On the final pass through the read test, the F1 flag will be set (block 372), and pass count will be zero (block 376). Therefore a return from the procedure will be made after clearing the F3 flag to indicate an absence of errors (block 382).

Multiplexer/demultiplexer test

Figure 15:
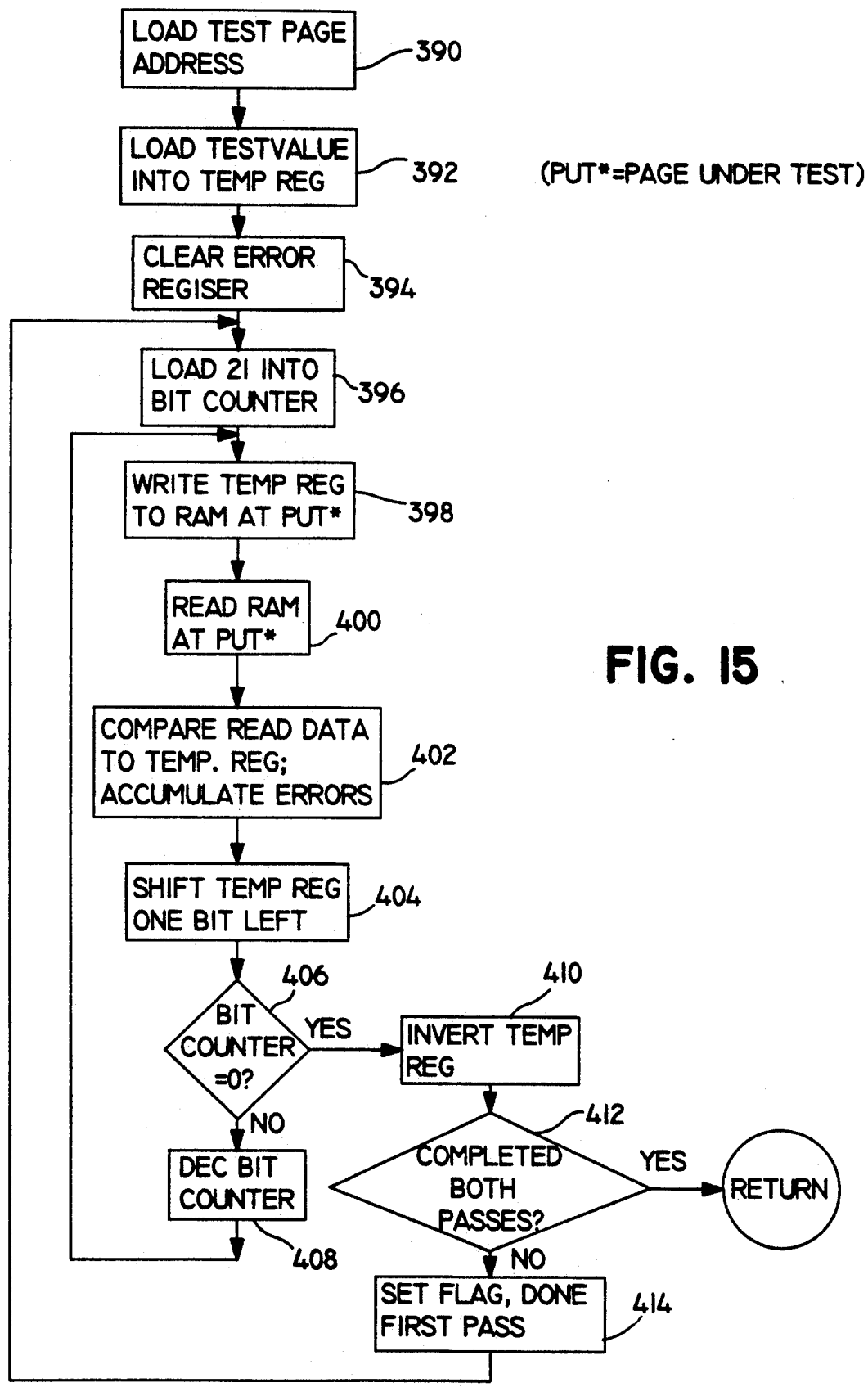
FIG. 15 is a flowchart of the multiplexer/demultiplexer test procedure.
Figure 16:
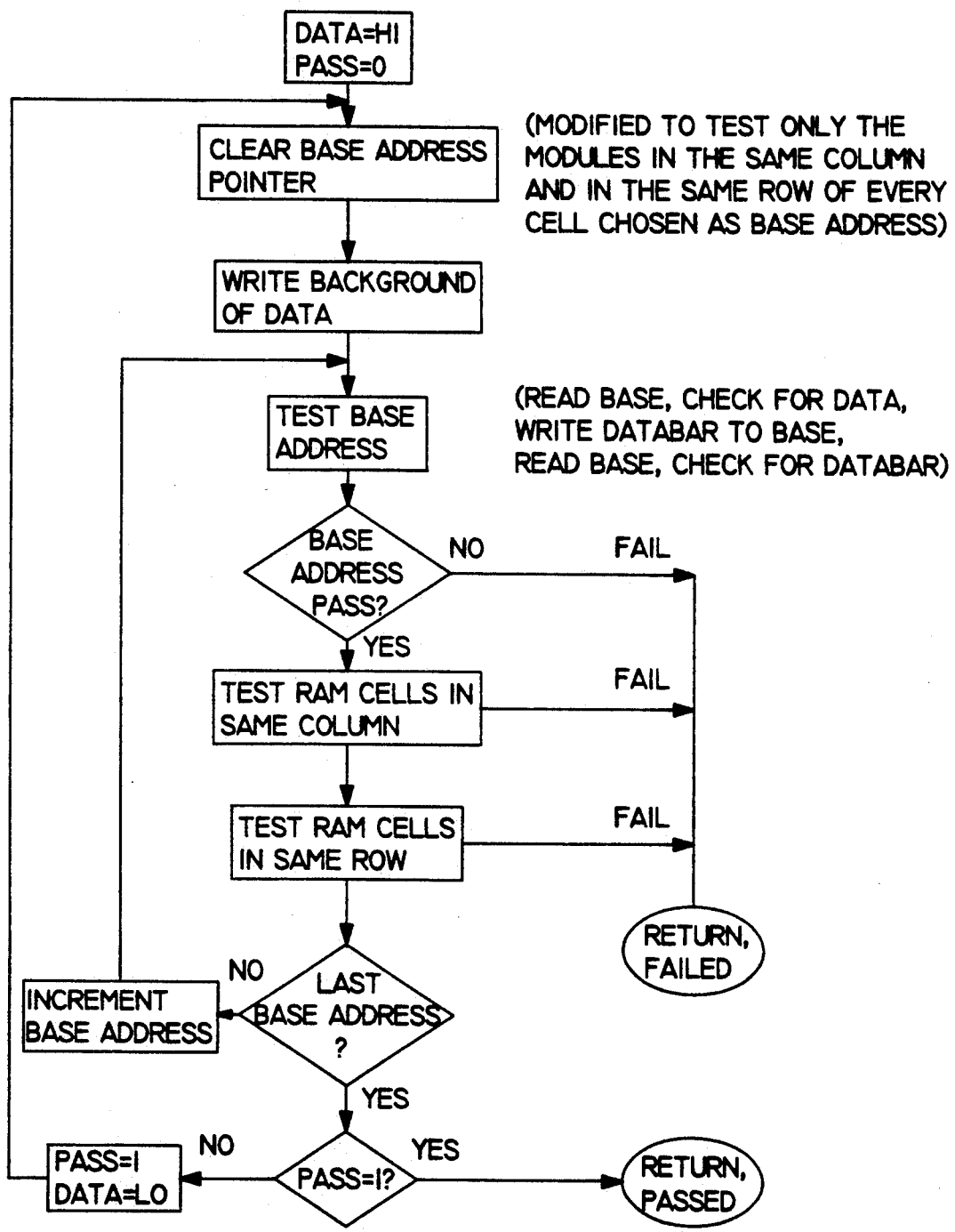
FIG. 16 is a flowchart of the galloping write recovery test procedure.
Figure 17:
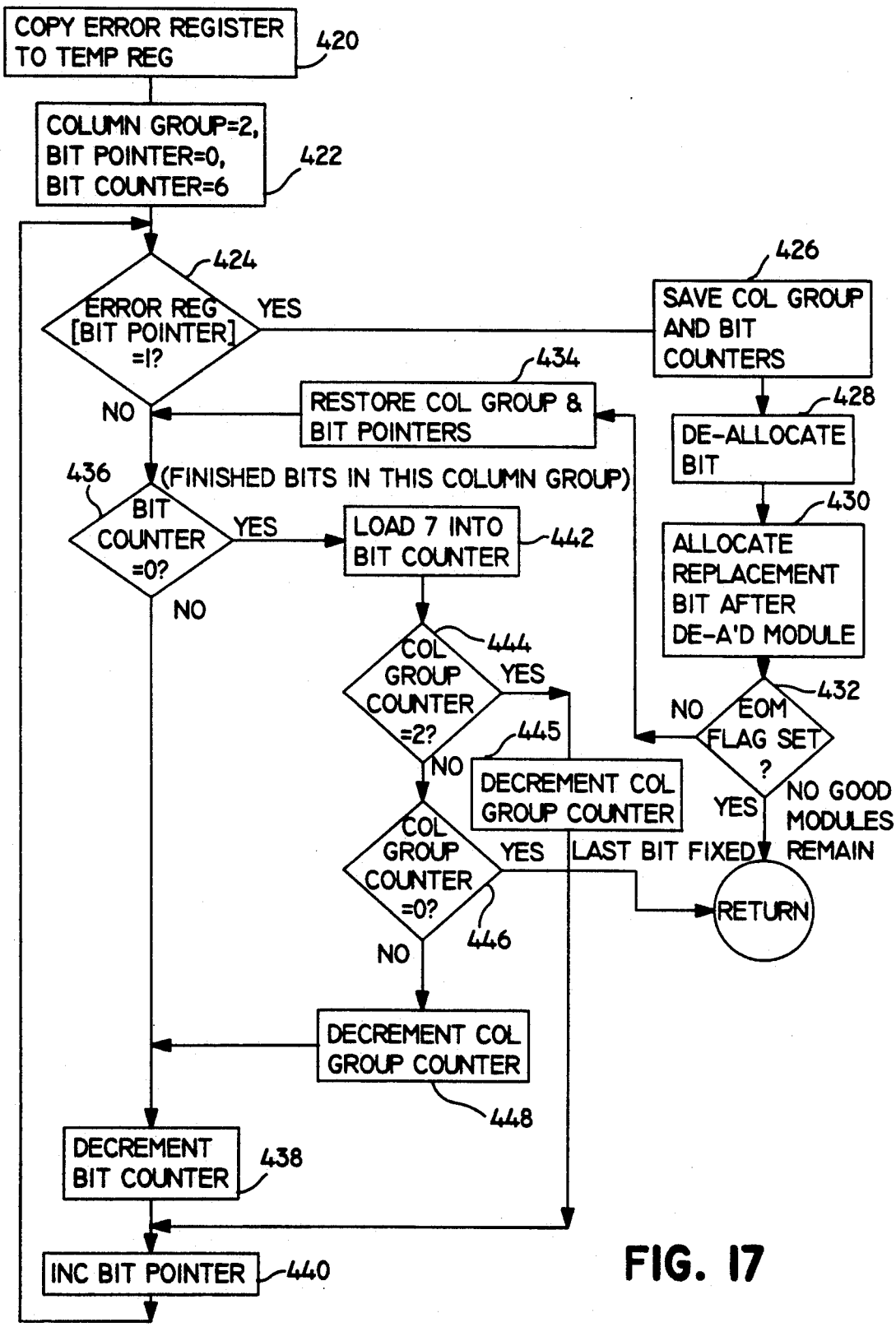
FIG. 17 is a flowchart of the fix bad bits procedure.
Figure 18:
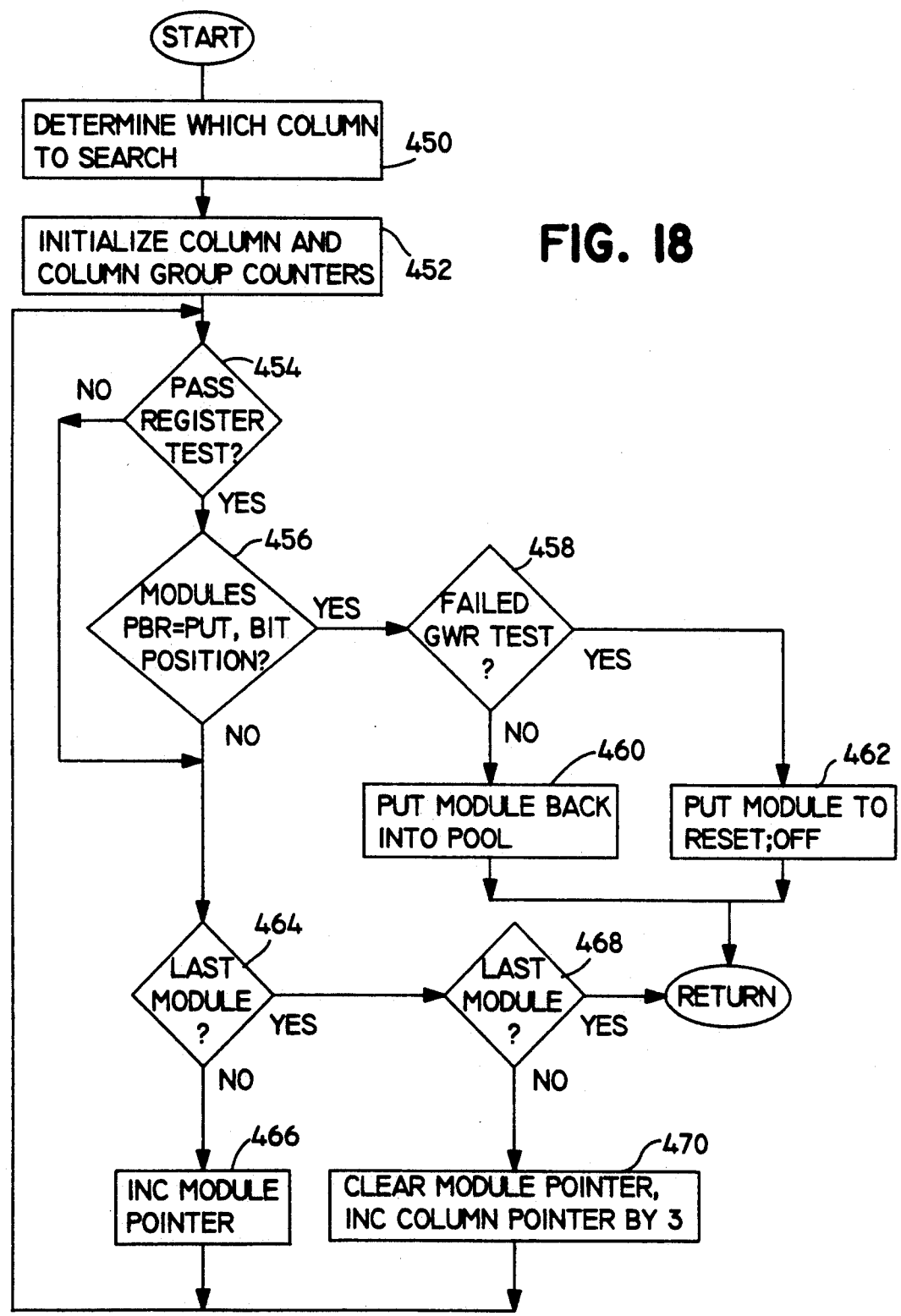
FIG. 18 is a flowchart of the bit de-allocation procedure.

The second major component of the page test procedure is the MUX/DEMUX test 304, shown in more detail in FIG. 15. A test page address is loaded (block 390), a test value is stored in a temporary register (block 392), and an error register is cleared (block 394). A bit counter is next initialized with a count of 21 (block 396), since there are 22 bits in each data word. Then the contents of the temporary register are written to the RAM at the page under test (block 398). The written data bits are then read back (block 400), and compared with the temporary register to detect any errors (block 402). The test value in the temporary register is then shifted one bit position to the left (block 404), and the bit counter is checked for zero (block 406). If not yet zero, the bit counter is decremented (block 408) and the procedure is repeated beginning again at block 398, with the writing of the temporary register to memory. When the bit counter reaches zero in this process (block 406), the temporary register is inverted (block 410), and it is determined (in block 412) whether both passes have been made of the procedure. If so, the procedure is complete. If not, a flag is set to indicate that the first pass is complete, and the procedure repeats beginning at block 398. That is to say, the procedure makes one pass using the test data value in twenty-two different bit positions, and a second pass using an inverted data value in all twenty-two bit positions. These tests are referred to, respectively, as "a walking one in a field of zeros" and "a walking zero in a field of ones." Although not indicated in FIG. 15, any detected errors result in the setting of the F3 flag, and its subsequent detection in the page test procedure of FIG. 13. The error flag is the logical OR of all bits in the error register, and will therefore be set if any mismatches are found.

Galloping write recovery test

The final component test of the page test procedure is the galloping write recovery test (block 282 of FIG. 13). This is a conventional RAM test and will not be described in detail. Its purpose is to verify operation of each RAM in the page under test. An exemplary flowchart is provided in FIG. 16. It will be understood that other conventional RAM tests may be employed instead of the galloping write recovery test.

Fix bad bits procedure

It will be recalled from the description of the allocation procedure (FIG. 10) that, after the page test (block 218), if there are indications of failure in any bit locations the fix bad bits procedure (block 222) is followed. This is shown in detail in FIG. 17.

An error register is first stored in a temporary register (block 420). Then, in block 422, the column group number is initialized at 2, a bit pointer is initialized at 0, and a bit counter is set to 6, to count seven bits. Next, the error register is examined at a bit position indicated by the bit pointer (block 424). If the examined bit is a one, indicating a bit error, the column group and bit counters are saved (block 426), and the bit is de-allocated (block 428). Then a replacement bit is allocated (430) and the end of memory (EOM) flag is checked (block 432). If the EOM is set, no good modules remain and a return is made from this procedure. If EOM is not set, the column group and bit pointers are restored (block 434), and the bit counter is checked for zero (block 436). This point in processing is also reached if the test in block 424 determines that there is no bit error. If the bit counter is not yet zero, it is decremented (block 438, and the bit pointer is incremented (block 440). Processing repeats beginning at block 424, to check the error register at other bit positions.

When all bit positions have been processed in this way, the bits in the next column group have to be similarly processed. To this end the bit counter is set to 7 (block 442), to handle eight bits in the middle column group, and the column group counter is checked (block 444). If the column group counter is 2, as it will be on the first occasion that this test is encountered, the column group counter is decremented to 1, and processing continues at block 440, so that the next eight bit positions may be processed. On the next pass through the test at block 444, the column group counter will be 1. It is next checked for a zero value (block 446) and, since not yet zero, is further decremented (block 448), and processing continues at block 438, decrementing the bit counter to an initial value of 6, so that the remaining seven bit positions may be processed. On the final pass through the procedure, the test at block 446 will find a zero column group counter and will exit from the procedure with all bad bits re-allocated as desired.

De-allocate bit procedure

As indicated in the fix bad bits procedure described above, bad bits may need to be de-allocated (block 428). This procedure is described in more detail with reference to FIG. 18.

The procedure first determines which column to search (block 450) and initializes column and column group pointers (block 452). If the module passes the register test (block 454), it is next determined (block 456) whether the module's page and bit register are set to the page under test and the current bit position. If so, it is next determined (block 458) whether the module passed the page compare or multiplexer/demultiplexer test. If not, the module is put back into the module pool (block 460), so that it may be tried again at another page or bit position. If the module failed the galloping write recovery test, a reset;off code is stored in the module (block 462). Failure of the galloping write recovery test is fatal to the module and it must be withdrawn from the pool of available modules. Failure of the page comparison test or the multiplexer/demultiplexer test may mean that the module is still usable for other page and bit assignments. In either case, a return is made from this procedure.

If the module fails the register test (block 454, or passes the register test and does not have the page under test and bit number in its page and bit register (block 456), a check is made for the last module (block 464), and the module pointer is incremented if this is not the last module in the column (block 466). After the last module in the column is checked, a further check is made for the last column (block 468). After the last column, return is made from this procedure. Otherwise, the column pointer is incremented by 3 and the module pointer zeroed again (block 470). The procedure de-allocates all modules at the page under test and current bit position.

Page de-allocation procedure

Figure 19:
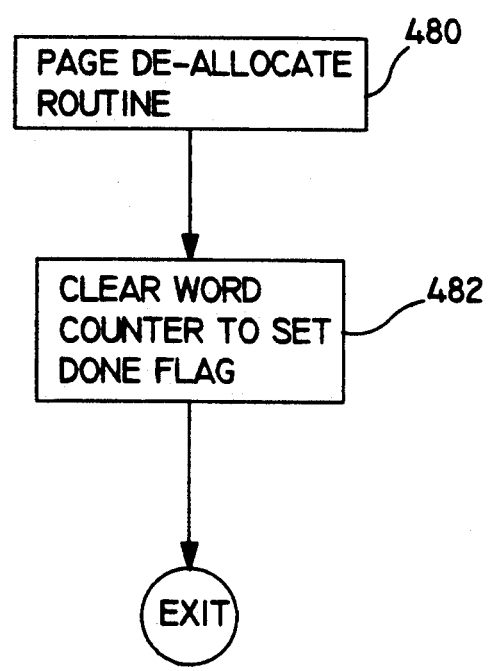
FIG. 19 is a flowchart of the page de-allocation executive.

Page de-allocation may be invoked from an executive procedure illustrated in FIG. 19. It consists of only two blocks: a call to the page de-allocation procedure (block 480), and block 482, in which a word counter is cleared and a done flag is set. The page de-allocation executive may be used to de-allocate pages in special situations, such as when a specific page is experiencing a large number of errors, or to de-allocate pages to bring the memory down to some smaller desired size.

The page de-allocation procedure may also be invoked by the the configuration executive (FIG. 6), or by the page repair executive, to be described in the next subsection. The configuration executive uses page de-allocation at the end of its configuration procedure, upon running out of good modules while allocating a page. This last incomplete page must be de-allocated, and the page de-allocation procedure is invoked for this purpose.

Page de-allocation could also be accomplished with the bit de-allocate procedure, but this would take 22 passes through the entire memory module array. The page de-allocation procedure accomplishes the same thing in one pass.

Figure 20:
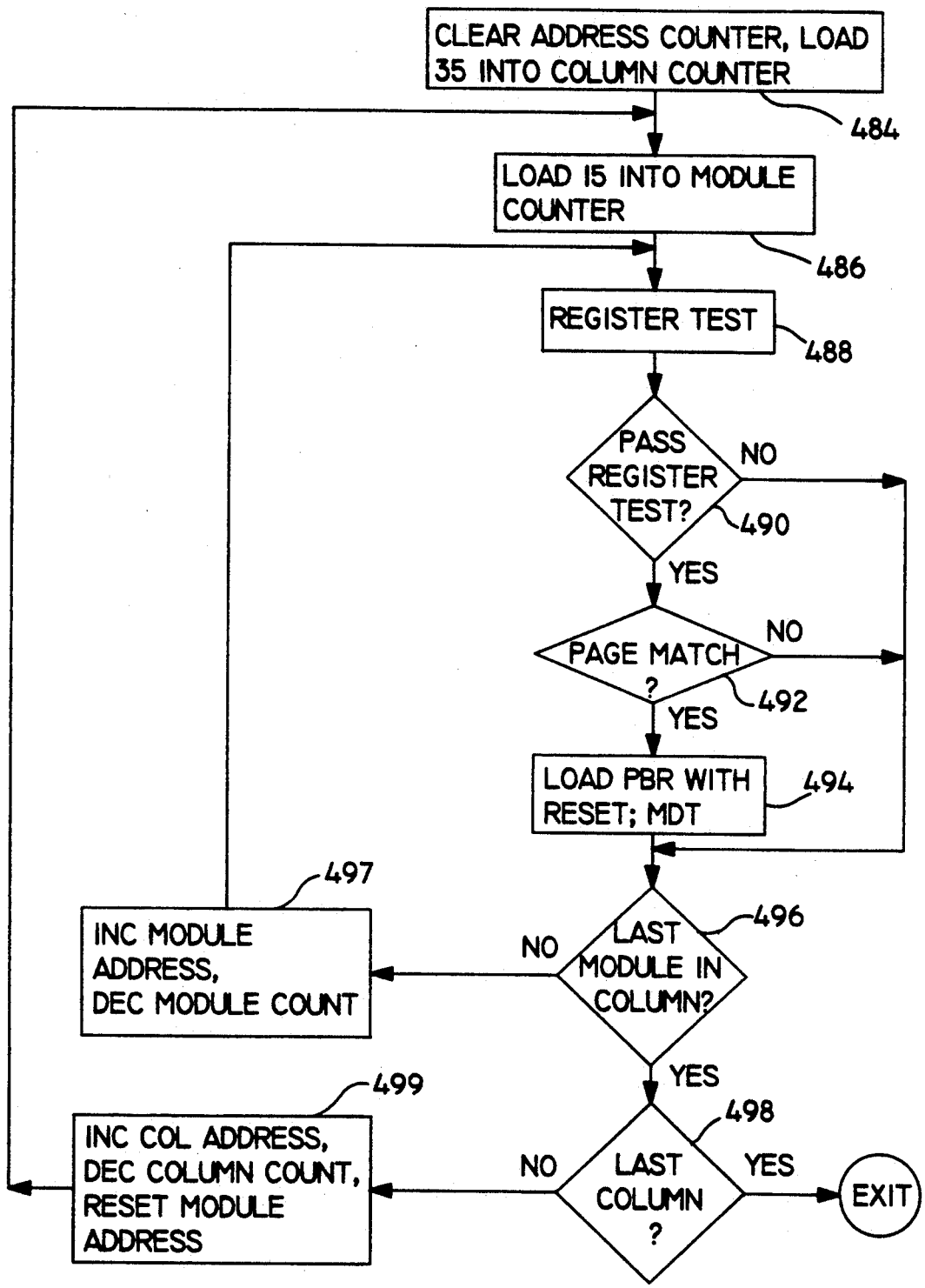
FIG. 20 is a flowchart of the page de-allocation procedure.

The page de-allocation procedure is shown in detail in FIG. 20. Initially, an address counter is cleared and a column counter is set to a count of 35 (block 484). Then a module counter is set to a count of 15 (block 486). A register test is next performed on the module defined by column and module address pointers (block 488). If the test is passed (block 490), it is determined whether there is a match (block 492) between the page assigned to the module's page and bit register and the page being de-allocated. If so, the module page and bit register is set with a reset;mdt code (block 494), indicating the module has been tested and has passed the module decode test. If the module does not pass the register test, or does not pass the page match test, the page and bit register is not changed.

A test in block 496 determines whether this is the last module in the column. If not, the module address pointer is incremented and the module counter is decremented (block 497), before repeating the procedure beginning at block 488, which is the register test. When the last module in the column is reached, a test is made to determine if this is the last column (block 498). If so, an exit is made from the procedure. If not, the column address pointer is incremented, the column counter is decremented, and the module address pointer is reset to point to the first module in the column (block 499. Again, processing continues at block 488, to examine other columns of modules.

Page repair executive procedure

The page repair executive is used to conduct a page test, and effect any possible repairs, on a specified page. The executive might be used, for example, to try to effect a repair on a page that was encountering many errors.

Figure 21:
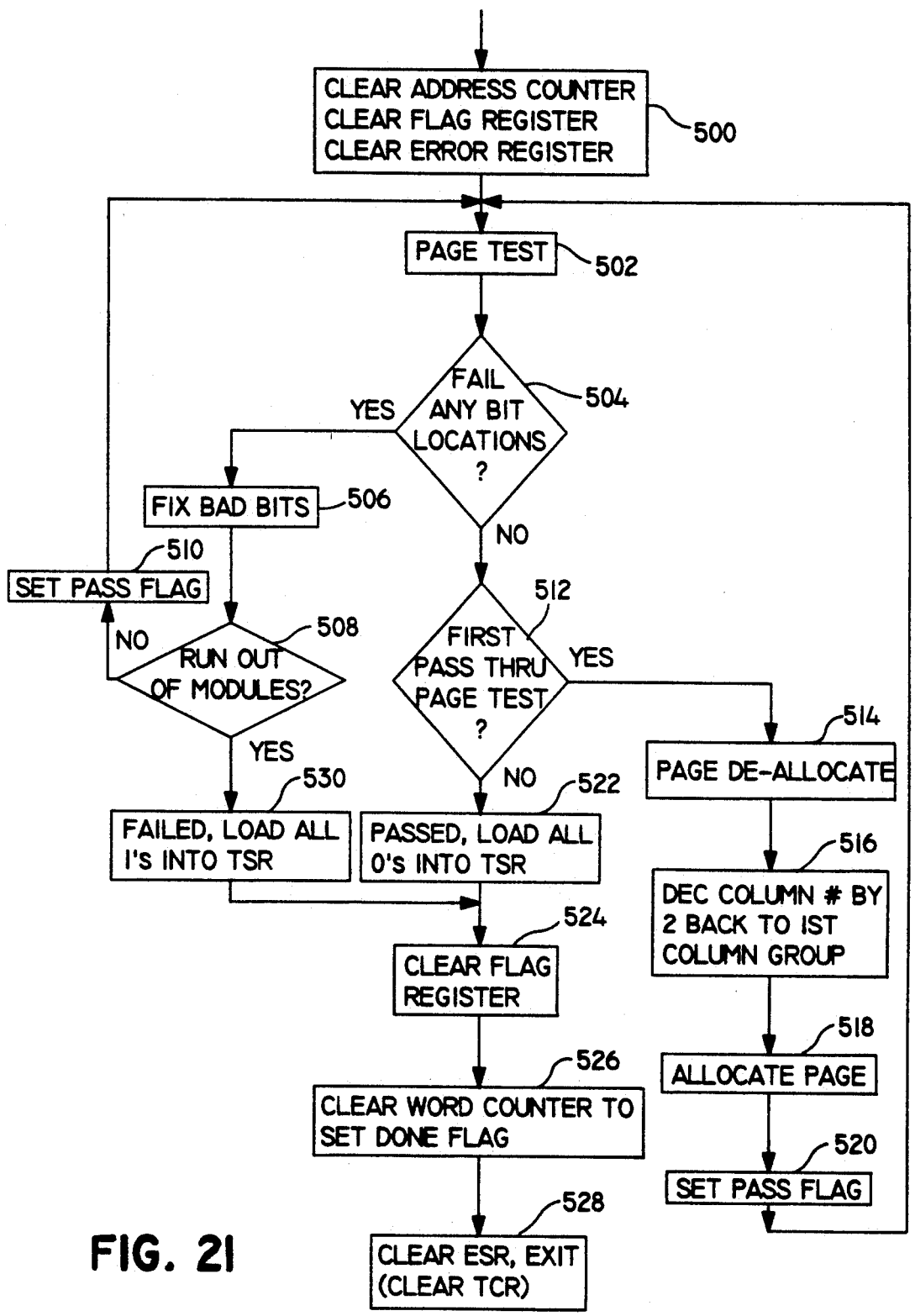
FIG. 21 is a flowchart of the page repair executive procedure.

Initially, as shown in FIG. 21, the page repair executive clears an address counter, a flag register and an error register (block 500). Then it performs a page test (block 502), which has already been described in detail. If any bit locations are indicating as failing as a result of the page test (block 504), the executive invokes the fix bad bits procedure (block 506). Then, if there are still good modules available, indicated by the end-of-memory (EOM) flag not being set, as determined in block 508, a pass flag is set (block 510), and return is made to block 502 to repeat the page test. This loop is repeated until either all the bit locations are fixed, as indicated by the test in block 504, or until there are no more good modules, as indicated by the test in block 508.

If there are no failed bit positions (block 504), and this is the first pass through the page test (block 512), the page is de-allocated (block 514). Then the column number is decremented by two, to point to the first column group (block 516), a new page is allocated (block 518), and the pass flag is set (block 520) before repeating the page test again (block 502).

If the test in block 512 determines that this is not the first pass through the page test, a register is loaded to indicate the page has been successfully repaired (block 522); then various housekeeping functions are performed (blocks 524, 526, 528). When the repair loop is terminated because there are no more good modules, a register is loaded to indicate that the executive has failed to repair the page (block 530).

Basically, the page repair executive repairs a specific page by using the fix bad bits procedure, or de-allocates the entire page and allocates another, or simply gives up if it runs out of good modules.

Summary

The memory architecture described operates automatically upon memory reset, usually when power is applied to the memory, to allocate memory modules to specific page addresses and bit locations within a data word. Initially, a bus test is run to test operations on the memory data buses; then a module decode test locates and tags good modules, selecting only those that respond to a unique address and pass a register test. The allocation then ensues, and invokes a page allocation procedure, which in turn invokes a bit allocation procedure. After allocation, each page of memory is tested by three test procedures: a page comparator test procedure, a multiplexer/demultiplexer test procedure, and a galloping write recovery RAM test procedure. If any bit positions fail as result of these tests, a procedure will be invoked to fix the bad bits by, in turn, invoking a bit de-allocation procedure. If a last page cannot be completely allocated because there are no more good modules, the partial page is deallocated by a page de-allocation procedure. In special situations, a page de-allocation executive may be used to de-allocate specific pages, and a page repair executive may be used to repair specific pages of memory.

It will be appreciated from the foregoing description that the present invention represents a significant advance in the field of large semiconductor memories, especially wafer-scale memories. In particular, the invention provides for the automatic testing and configuration of such memories either before or after installation. It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A memory circuit, addressable by a logical memory address that includes a memory page address and a memory word address within a specified page, the circuit comprising:

a plurality of memory modules, wherein predefined sets of the memory modules comprise uniquely addressable memory pages, and each memory module has at least as many bits as there are memory words in a memory page;

a global data bus having as many data lines as there are bits in a data word, connected to the memory modules in a selected configuration, to carry data to and from the modules;

a global address bus connected to the memory modules, to carry a logical address to the modules;

memory module mapping means connected to each of the memory modules, for associating each combination of memory page and bit position within each data word on that page, with a selected memory module that is unique to the combination of memory page and bit position; and memory circuit testing and configuration means integral with the memory circuit and connected to the memory modules, for automatically testing each of the memory modules and recording, in the memory module mapping means, codes that associate each memory page and bit position combination with a memory module that is unique to the combination of memory page and bit position.

2. A memory circuit as defined in claim 1, wherein the memory circuit testing and configuration means includes:

means for testing each memory module to determine that the module responds to only one preselected module address;

means for testing interconnections between the global data bus and the memory modules; and means for storing a code pertaining to each tested module identifying the module as having passed or failed the tests, wherein those modules that have passed the tests form a pool of good modules.

3. A memory circuit as defined in claim 2, wherein:

the memory module mapping means includes components distributed among the memory modules;

each memory module includes a random access memory (RAM), a page and bit register that forms part of the memory module mapping means, and a page address comparator for comparing a page address stored in the page and bit register with a page address used to address the memory modules; and the memory circuit testing and configuration means further includes means for testing the page and bit register.

4. A memory circuit as defined in claim 3, wherein the memory circuit testing and configuration means further includes:

means for allocating a logical page of memory to a plurality of memory modules, wherein the means for allocating a logical page of memory includes means for allocating each bit position to a memory module, wherein each module to which a bit position is allocated is selected from the pool of good modules.

5. A memory circuit as defined in claim 4, wherein the memory circuit testing and configuration means further includes:

means for testing each logical page of memory allocated by the means for allocating a logical page of memory.

6. A memory circuit as defined in claim 5, wherein the means for testing each logical page of allocated memory includes:

means for testing the page address comparator of each memory module assigned to the page.

7. A memory circuit as defined in claim 6, wherein:

each memory module further includes a multiplexer/demultiplexer, connected to the global data bus and to the page and bit register, for selecting one data line from a plurality of data lines included in the global data bus, based on the bit position stored in the page and bit register; and the means for testing each logical page of allocated memory further includes means for testing the multiplexer/demultiplexer.

8. A memory circuit as defined in claim 7, wherein:

the memory modules are arranged in columns of n modules each, where n is a selected integer, and the columns are divided into m column groups, where m is an integer smaller than the number of bits in each data word; and the number of data lines from the global data bus is divided approximately uniformly among the m column groups, to reduce the complexity of data busing requirements.

9. A memory circuit as defined in claim 7, wherein:

the means for testing each logical page of allocated memory further includes means for testing the RAM in each memory module associated with the page.

10. A memory circuit as defined in claim 4, wherein the memory circuit testing and configuration means further includes:

means for de-allocating a bit position from a memory module that has not passed a test, and reallocating the bit position to a different memory module selected from the pool of good modules.

11. A memory circuit as defined in claim 4, wherein the memory circuit testing and configuration means further includes:

means for de-allocating a complete logical page of memory that was previously allocated.

12. A method of automatically testing and configuring a memory circuit having a plurality of memory modules addressable by a logical memory address that includes a memory page address and a memory work address within a specified page, the method comprising the steps of:

preliminarily testing each of the plurality memory modules;

establishing a pool of good memory modules as a result of the testing step;

allocating each logical page of memory to a plurality of memory modules selected from the pool of good modules, including the step of allocating each bit position within data words in that page, to a particular memory module, wherein each page of memory has a page number associated with as many memory modules as there are bits within a data word; and testing each logical page of memory to determine that the memory modules assigned to the page are fully operational.

13. A method as defined in claim 12, wherein:

each memory module has a page and bit register for assignment of the module to a particular logical page and a particular bit position within each data word; and the preliminary testing step includes testing the page and bit register.

14. A method as defined in claim 13, wherein:

the memory modules are connected to a global data bus; and the preliminary testing step further includes testing connections between the modules and the global data bus, and testing to determine whether each module is uniquely addressable.

15. A method as defined in claim 12, wherein:

each memory module includes a random access memory (RAM), a page and bit register, and a page address comparator for comparing a page address stored in the page and bit register with a page address supplied used to address the memory modules; and the step of testing each logical page of memory further includes testing the page address comparator of each memory module assigned to the page, and testing the RAM in each memory module assigned to the page.

16. A method as defined in claim 15, wherein:

each memory module further includes a multiplexer/demultiplexer for selecting from a plurality of data lines supplied from the global data bus, based on the bit position stored in the page and bit register; and the step of testing each logical page of memory further includes testing the multiplexer/demultiplexer.

17. A method as defined in claim 16, wherein:

the memory modules are arranged in columns of n modules each, where n is a selected integer, and the columns are divided into m column groups, where m is an integer smaller than the number of bits in each data word;

the number of data lines from the global data bus is divided as uniformly as possible among the m column groups, to reduce the complexity of data busing requirements;

the method includes the step of selecting, in the multiplexer/demultiplexer of each memory module, one of the data bits assigned to a column group in which the memory module is located; and a bit position field of the page and bit register is used to determine which of the data bits assigned to this column group is associated with this particular memory module.

18. A method as defined in claim 17, wherein:

the step of allocating a logical page of memory is performed by selecting successive memory modules from successive columns of modules, such that the modules assigned to a particular page are distributed over multiple module columns.

19. A method as defined in claim 12, and further comprising the steps of:

de-allocating selected bit positions within the words of a page, based on the results of the testing step; and reallocating different memory modules to the same bit positions, selected from the pool of good modules.

20. A method as defined in claim 19, and further comprising the steps of:

de-allocating a logical page of memory, if a complete page cannot be allocated from the pool of good modules or if the page cannot be repaired.

* * * * *